(12) United States Patent
Sumita

(10) Patent No.: US 7,639,062 B2
(45) Date of Patent: Dec. 29, 2009

(54) ELECTRONIC DEVICE AND COMMUNICATION DEVICE COMPRISING THE SAME

(75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 49 days.

(21) Appl. No.: 11/949,363

(22) Filed: Dec. 3, 2007

(65) Prior Publication Data

US 2008/0136493 A1 Jun. 12, 2008

(30) Foreign Application Priority Data

Dec. 6, 2006 (JP) ............................. 2006-329278

(51) Int. Cl.
*H03K 17/0412* (2006.01)

(52) U.S. Cl. ..................... 327/374; 327/387; 327/392; 326/85; 326/87

(58) Field of Classification Search ................. None
See application file for complete search history.

(56) References Cited

U.S. PATENT DOCUMENTS

| 5,686,853 A | 11/1997 | Iima et al. |
| 5,889,417 A * | 3/1999 | Klass et al. .................. 326/98 |
| 6,696,860 B2 * | 2/2004 | Lim et al. ..................... 326/83 |

FOREIGN PATENT DOCUMENTS

JP 8-186482 7/1996

OTHER PUBLICATIONS

Nalamalpu, A., et al., "Boosters for Driving Long Onchip Interconnects—Design Issues, Interconnect Synthesis, and Comparison With Repeaters", IEEE Transactions on Computer-Aided Design of Integrated Circuits and Systems, Jan. 2002, vol. 21 No. 1.

* cited by examiner

*Primary Examiner*—An T Luu
(74) *Attorney, Agent, or Firm*—McDermott Will & Emery LLP

(57) ABSTRACT

In an electronic device according to the present invention, a source of the first signal-wire drive transistor is connected to a first power supply, a drain of the first signal-wire drive transistor is connected to a signal wire, and a control circuit controls a gate voltage so that a current flowing in the signal wire is amplified toward a voltage to which a potential of the signal wire transits during the potential transition in the signal wire and further controls the gate voltage so that a voltage value obtained after the potential transition in the signal wire is retained after the potential transition in the signal wire.

25 Claims, 14 Drawing Sheets

F I G. 1 5
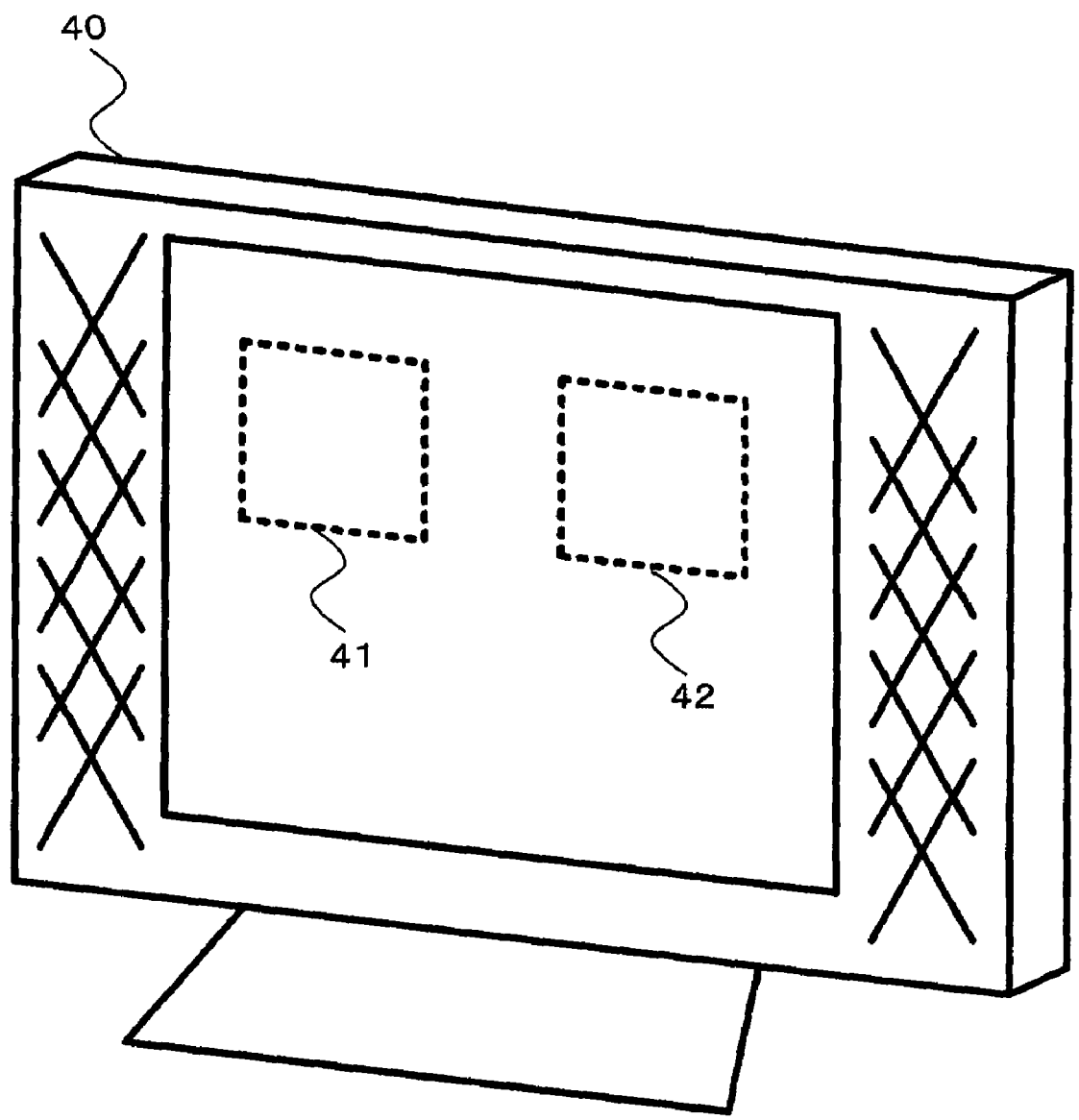

ELECTRONIC DEVICE AND COMMUNICATION DEVICE COMPRISING THE SAME

BACKGROUND OF THE INVENTION

1. Field of the Invention

The present invention relates to an electronic device, more particularly to a technology for increasing an operation speed and reducing a circuit area and power consumption in an electronic device for amplifying voltage transition in a signal wire inside and outside of a semiconductor integrated circuit.

2. Description of the Related Art

Along with the miniaturization of the manufacturing process of a semiconductor integrated circuit, a wiring aperture in a chip constituting the semiconductor integrated circuit is increasingly thinner, and a wiring resistance is on the steady increase. In relation to an inter-chip wiring, a board-level chip mounting density has been increasing as the mounting technology advances in recent years, which results in an increase in inter-chip connection wiring resistance.

In order to prevent the reduction of an operation speed in the chip due to the increased wiring resistance, a repeater (relaying buffer) is inserted between interfaces (I/F), in the case of I/F which demands a relatively long wire (>1 mm) such as a signal I/F between functional blocks inside the chip, so as to divide the resistance of the long wire, thereby realizing the speedup of the operation.

However, the insertion of the repeater is only effective in the case of I/F where a signal is transmitted or received in one fixed direction. In the case of I/F for a bidirectional bus (transmission and reception are not limited to one direction), it is necessary to use, not a buffer having a simple structure, but one having a tristate structure, as the repeater, and it thereby becomes necessary to prepare the tristate buffers in all directions which the signal is propagated. Further, it is necessary to provide a control signal wire for controlling the direction in which the signal is propagated, which unfavorably invites an increase in a circuit area and power consumption. This problem was solved by electronic devices called a booster circuit and regenerator circuit, examples of which are recited in No. H08-186482 of the Japanese Patent Applications Laid-Open (hereinafter, referred to as conventional example 1), and Ankireddy Nalamalpu, et al.: Boosters for Driving Long Onchip Interconnects-Design Issues, Interconnect Synthesis, and Comparison With Repeaters IEEE TRANSACTIONS ON COMPUTER-AIDED DESIGN OF INTEGRATED CIRCUITS AND SYSTEM, VOL. 21, No. 1, JANUARY 2002 (hereinafter, referred to as conventional example 2).

In the respective electronic devices for amplifying voltage transition in a signal wire, which are recited in the conventional examples 1 and 2, a maximum drive unit for amplifying a current with respect to the signal wire comprises serial transistors in two stages. Therefore, the performance of a transistor in each stage is required to be twice as much in order to realize voltage transition time equal to that of the repeater (buffer). Accordingly, a gate width and a gate capacitance of the transistor need to be doubled, which consequently requires electric power twice as much as that of the repeater. In the conventional example 2 (structure comprising a Schmitt trigger circuit) which is structurally fragile with respect to an input noise of the signal wire, it is necessary to additionally provide a voltage retaining circuit (positive-feedback buffer) in the signal wire. However, an area of the voltage retaining circuit itself is increased, and an amplification factor toward a voltage to which a potential of the signal wire transits is reduced.

SUMMARY OF THE INVENTION

Therefore, a main object of the present invention is to reduce a circuit area and power consumption while maintaining voltage transition time in a signal wire equal to that of a repeater in an electronic device capable of amplifying voltage transition in the signal wire.

In order to achieve the foregoing object, the present invention is constituted as follows.

1) An electronic device according to the present invention comprises:
  a signal wire;
  a first signal-wire drive transistor; and
  a control circuit for detecting a transition state of the signal wire and controlling a gate voltage of the first signal-wire drive transistor, wherein
  a source of the first signal-wire drive transistor is connected to a first power supply,
  a drain of the first signal-wire drive transistor is connected to the signal wire, and
  the control circuit controls the gate voltage so that a current flowing in the signal wire is amplified toward a voltage to which the potential of the signal wire transits during the potential transition in the signal wire, and the control circuit further controls the gate voltage so that a voltage value obtained after the potential transition in the signal wire is retained after the potential transition in the signal wire.

Accordingly, the number of serial stages of the transistor for driving the signal wire can be one. Further, it is unnecessary to additionally provide a voltage retaining circuit in the signal wire in order to retain the potential of the signal wire. Therefore, the circuit area and power consumption can be both reduced.

2) The electronic device preferably further comprises a second signal-wire drive transistor having a polarity reverse to that of the first signal-wire drive transistor, wherein
  a source of the second signal-wire drive transistor is connected to a second power supply having a polarity reverse to that of the first power supply,
  the drain of the first signal-wire drive transistor is connected to the signal wire, and
  the control circuit further controls a gate voltage of the second signal-wire drive transistor. Accordingly, the number of serial stages of the transistor for driving the signal wire can be one when the potential of the signal wire reversely transits. As a result, the potential of the signal wire can be retained without the additional provision of the voltage retaining circuit in the signal wire, and the circuit area and power consumption can be both reduced.

3) The control circuit preferably comprises a voltage retaining circuit, wherein
  the voltage retaining circuit retains the gate voltage of the first signal-wire drive transistor so that the voltage value obtained after the potential transition in the signal wire is retained after the potential transition in the signal wire. Accordingly, anti-noise performance in the signal wire can be highly accurately retained irrespective of variability in a manufacturing process of the electronic device, variation of the power-supply voltage and temperature variation.

4) The voltage retaining circuit preferably comprises a diode, wherein
  a cathode of the diode is connected to a gate of the first signal-wire drive transistor. Accordingly, such a voltage value that is necessary for the current between the source and the gate of the first signal-wire drive transistor to show the non-saturation current characteristic can be generated as the gate voltage of the first signal-wire drive transistor. As a result, the voltage value after the transition in the signal wire can be retained.

5) A first voltage-retaining MOS transistor in which a gate and a drain are connected to each other preferably constitutes the diode. Accordingly, an additional step such as the separation of a well in the CMOS process required to form the diode becomes unnecessary. As a result, the circuit area can be reduced, and further, the circuit design can be more facilitated.

6) A source of the first voltage-retaining MOS transistor is preferably connected to the first power supply. Accordingly, the current variation generated in the first signal-wire drive transistor due to the variation of the power-supply voltage in the electronic device can be monitored, and the gate voltage depending on an amount of the current variation can be applied to the first signal-wire drive transistor. As a result, the anti-noise performance of the signal wire can be highly accurately retained. Further, such a circuit configuration that has a mirror-symmetrical structure relative to the first signal-wire drive transistor can be realized, and the performance by which the gate voltage of the first signal-wire drive transistor can be retained at an arbitrary value with a high accuracy can be maintained. This effect can still be obtained when the variability is generated in the manufacturing process. Further, because the current mirror circuit relative to the first signal-wire drive transistor can be realized according to the foregoing constitution, the gate voltage of the first signal-wire drive transistor can be controlled so as to obtain an arbitrary current ratio relative to the current amount between the source and the drain of the first voltage-retaining MOS transistor. As a result, the gate voltage of the first signal-wire drive transistor can be easily controlled.

7) A substrate voltage of the first voltage-retaining MOS transistor is preferably controllable. Accordingly, the amount of the current variation of the first signal-wire drive transistor, which is generated by the variability in the manufacturing process of the electronic device, can be compensated when the substrate voltage of the first voltage-retaining MOS transistor is controlled. Therefore, the gate voltage depending on the amount of the current variation of the first signal-wire drive transistor can be applied to the first signal-wire drive transistor. As a result, the anti-noise performance of the signal wire can be highly accurately retained.

8) The voltage retaining circuit preferably further comprises a DC-cutting MOS transistor, wherein a drain of the DC-cutting MOS transistor is connected to a gate of the first voltage-retaining MOS transistor, and a source of the DC-cutting MOS transistor is connected to a drain of the first voltage-retaining MOS transistor. Accordingly, the current mirror circuit comprising the first signal-wire drive transistor and the first voltage-retaining MOS transistor can control the connection between the gate and the drain of the first voltage-retaining MOS transistor. As a result, the DC current can be cut off, which results in the reduction of the power consumption.

9) The control circuit preferably comprises a delay circuit to which a signal is inputted from the signal wire, wherein a gate of the DC-cutting MOS transistor is connected to an inversion output of the delay circuit. Accordingly, the circuit comprising the first signal-wire drive transistor and the first voltage-retaining MOS transistor functions as the current mirror circuit only after a certain period of time subsequent to the start of the potential transition in the signal wire. As a result, the power which is unnecessarily consumed before the current mirror circuit is operated can be reduced.

10) The electronic device preferably further comprises a direct-current-cutting switch circuit controlled by the signal wire, wherein the cathode of the diode is connected to one of input terminals of the direct-current-cutting switch circuit, and the second power supply having the polarity reverse to that of the first power supply is connected to the other input terminal of the direct-current-cutting switch circuit. Accordingly, the voltage value of the drain of the first voltage-retaining MOS transistor can be variably controlled in accordance with the transition state of the signal wire. As a result, the voltage retaining circuit can more easily controls the gate voltage of the first signal-wire drive transistor.

11) The direct-current-cutting switch circuit preferably comprises two switching MOS transistors serially connected to each other and being opposite in polarity, wherein the switching MOS transistor having the same polarity as that of the first voltage-retaining MOS transistor is connected to the drain of the first voltage-retaining MOS transistor, and gates of the switching MOS transistors are connected to the signal wire. Accordingly, the drain of the first voltage-retaining MOS transistor is connected to the second power supply only when the potential of the signal wire transits. As a result, the DC current can be cut off, which results in the reduction of the power consumption.

12) The control circuit preferably comprises a transition-amplifying switch circuit controlled by the signal wire, wherein the gate of the first signal-wire drive transistor is connected to one of input terminals of the transition-amplifying switch circuit, and a power supply having the same polarity as that of the first power supply is connected to the other input terminal of the transition-amplifying switch circuit. Accordingly, it can be controlled whether or not the gate voltage of the first signal-wire drive transistor is set to the power-supply voltage value depending on the transition state of the signal wire.

13) The transition-amplifying switch circuit preferably comprises a switch-circuit MOS transistor having the same polarity as that of the first signal-wire drive transistor, wherein a gate of the switch-circuit MOS transistor is connected to the signal wire, and a drain of the switch-circuit MOS transistor is connected to the gate of the first signal-wire drive transistor. Accordingly, in the case where the potential of the signal wire has the polarity reverse to that of the power-supply voltage connected to the first signal-wire drive transistor, the gate voltage of the first signal-wire drive transistor is equal to the power-supply voltage, and the first signal-wire drive transistor is thereby cut off. As a result, any unnecessary current flow in the signal wire, which possibly prevents the voltage transition in the signal wire, can be prevented. As a result, the power consumption can be reduced.

14) The control circuit preferably comprises a current amplifying circuit, wherein the current amplifying circuit controls the gate voltage so that the current flowing in the signal wire is amplified toward the voltage to which the potential of the signal wire transits during the potential transit in the signal wire. Accordingly, the current flows from the first signal-wire drive transistor toward the voltage to which the potential of the signal wire transits. As a result, the voltage can rapidly transit in the signal wire.

15) The current amplifying circuit preferably comprises first and second current-amplifying MOS transistors, wherein a drain of the first current-amplifying MOS transistor is connected to the gate of the first signal-wire MOS transistor, a source of the first current-amplifying MOS transistor is connected to a drain of the second current-amplifying MOS transistor, and a source of the second current-amplifying MOS transistor is connected to the second power supply having the polarity reverse to that of the first power supply. Accordingly, the gate voltage of the first signal-wire drive transistor can be controlled so that it has the potential reverse to that of the source voltage of the first signal-wire drive transistor. As a result, the voltage of the signal wire can rapidly transit.

16) The control circuit preferably comprises a delay circuit to which a signal is inputted from the signal wire, wherein the delay circuit comprises an inversion output, and a gate of one of the first and second current-amplifying MOS transistors is connected to the signal wire, and a gate of the other current-amplifying MOS transistor is connected to the inversion output of the delay circuit. Accordingly, the gate voltage of the first signal-wire drive transistor can be controlled so that it has the potential reverse to that of the source voltage of the first signal-wire drive transistor only in a certain period of time during which the potential of the signal wire transits. As a result, the precipitous voltage transition in the signal wire is made possible, and a leak current at the gate of the first signal-wire drive transistor can be reduced.

17) The delay circuit can preferably change its delay amount depending on a waveform tilt of the signal wire. Accordingly, the potential transition time in the signal wire can be accurately detected depending on the waveform tilt of the signal wire (unit: voltage/time; also called slew rate), and the gate voltage of the first signal-wire drive transistor can be thereby more reliably controlled so that it has the potential reverse to that of the source voltage of the first signal-wire drive transistor depending on the detected potential transition time. As a result, the rapid voltage transition in the signal wire can be obtained, and the leak current at the gate of the first signal-wire drive transistor can be reduced.

18) The current amplifying circuit can preferably change its output voltage depending on a cycle of the voltage waveform in the signal wire. Accordingly, a current capacity of the first signal-wire drive transistor can be adjusted depending on a cycle of the signal transition. As a result, the power which is unnecessarily consumed can be reduced.

19) The current amplifying circuit preferably comprises a flip-flop to which data is inputted from the signal wire, wherein the flip-flop variably controls a output voltage of the current amplifying circuit depending on an immediate value and a previous value of the signal wire. Accordingly, the current capacity of the first signal-wire drive transistor can be adjusted in accordance with on the transition state of the signal wire, which results in the reduction of the power which is unnecessarily consumed. Furthermore, since the amplitude of the signal wire can be modulated, the signal can be more stably transmitted.

20) The electronic device preferably further comprises a clock wire provided along the signal wire, wherein a clock is supplied from the clock wire to the flip-flop, and the clock synchronizes with the signal transmitted on the signal wire. Accordingly, a data value of the flip-flop can be stored by the clock synchronizing with the signal wire, and a set-up error, a hold error or a similar error hardly arise. As a result, the immediate value and the previous value of the signal wire can be more reliably utilized, and the signal transmission can be thereby stabilized.

21) The current amplifying circuit preferably selectively controls the gate voltage of each of the first signal-wire drive transistors depending on the cycle of the voltage waveform in the signal wire. Accordingly, the current capacity of the first signal-wire drive transistor can be adjusted with a high accuracy, and the power which is unnecessarily consumed can be reduced.

22) The electronic device preferably further comprises a resistance element connected to the signal wire, wherein the delay circuit is a differential circuit, and one of differential input signals of the differential circuit is supplied from the signal wire, and the other differential input signal is supplied from an end of the resistance element. Accordingly, the voltage transition at a minor level in the signal wire can be detected, and a result of the detection can be transmitted to the current amplifying circuit. As a result, the voltage transition in the signal wire can achieve a higher speed.

23) The electronic device preferably further comprises a second signal-wire drive transistor having a polarity reverse to that of the first signal-wire drive transistor and controlled by the control circuit, wherein the delay circuit is a differential circuit, and one of differential input signals of the differential circuit is supplied from the signal wire, and the other differential input signal is supplied from a gate of the second signal-wire drive transistor. Accordingly, a difference between a voltage value of one of the input signals of the differential circuit and the voltage value to which the potential of the signal wire transits is only a few hundred mV. Therefore, the differential circuit can more speedily detect the voltage transition of the signal wire, and transmit the relevant information to the current amplifying circuit. As a result, the voltage transition in the signal wire can achieve a higher speed.

24) The current amplifying circuit preferably further comprises a bypass MOS transistor, wherein the bypass MOS transistor is connected in parallel to the first current-amplifying MOS transistor or the second current-amplifying MOS transistor whose the gate is connected to the signal wire, and a normal-rotation output of the differential circuit is connected to a gate of the bypass MOS transistor. Accordingly, the differential circuit can more speedily detect the voltage transition of the signal wire and transmit the relevant information to the current amplifying circuit, and the bypass MOS transistor speedily shows the saturation current characteristic. As a result, the voltage transition in the signal wire can achieve a higher speed.

The present invention includes the following modes other than the main modes described so far.

A gate oxide film of the first voltage-retaining MOS transistor preferably has a thickness larger than that of the first signal-wire drive transistor. Accordingly, a threshold value of the first voltage-retaining MOS transistor is higher than that of the first signal-wire drive transistor, and it becomes easier to generate the gate voltage value necessary for the current between the source and the drain of the first signal-wire drive transistor to show the non-saturation current characteristic. Further, the leak current at the gate of the first voltage-retaining MOS transistor can be reduced.

The threshold value of the first voltage-retaining MOS transistor is preferably higher than that of the first signal-wire drive transistor. Accordingly, the threshold value of the first voltage-retaining MOS transistor is higher than that of the first signal-wire drive transistor, and it becomes easier to generate the gate voltage value necessary for the current between the source and the drain of the first signal-wire drive transistor to show the non-saturation current characteristic. Further, the leak current between the source and the drain (sub-threshold) of the first voltage-retaining MOS transistor can be reduced.

A gate length of the first voltage-retaining MOS transistor preferably has a dimension larger than that of the first signal-wire drive transistor. Accordingly, the threshold value of the first voltage-retaining MOS transistor is higher than that of the first signal-wire drive transistor, and it becomes easier to generate the gate voltage value necessary for the current flowing between the source and the drain of the first signal-wire drive transistor to show the non-saturation current characteristic. Further, the leak current between the source and the drain of the first voltage-retaining MOS transistor can be reduced.

A gate width of the first voltage-retaining MOS transistor preferably has a dimension smaller than that of the first signal-wire drive transistor. Accordingly, the threshold value of the first voltage-retaining MOS transistor is higher than that of the first signal-wire drive transistor, and it becomes easier to generate the gate voltage value necessary for the current between the source and the drain of the first signal-wire drive transistor to show the non-saturation current characteristic. Further, the leak current between the source and the drain of the first voltage-retaining MOS transistor can be reduced.

The voltage retaining circuit preferably comprises a second voltage-retaining MOS transistor, wherein the source of the first voltage-retaining MOS transistor is connected to a gate and a drain of the second voltage-retaining MOS transistor. Accordingly, a voltage value of the source of the first voltage-retaining MOS transistor is different to a voltage value of the source of second voltage-retaining MOS transistor by a threshold value of the second voltage-retaining MOS transistor. As a result, it becomes easier to control the gate voltage value of the first signal-wire drive transistor so that the value becomes a value necessary for the first signal-wire drive transistor to show the non-saturation region characteristic.

An inverter comprising an MOS transistor is preferably connected in parallel to the resistance element. Accordingly, the minor voltage transition in the signal wire can be amplified and transmitted to the differential circuit. As a result, the voltage transition in the signal wire can achieve a higher speed.

The first signal-wire drive transistor and the control circuit are preferably placed between transmitting and receiving circuits in the signal wire. Accordingly, the voltage transition can be more speedily performed in a signal transmitted from the transmitting circuit, and the signal can be transmitted to the transmitting circuit at a high speed.

The first signal-wire drive transistor and the control circuit are preferably placed at positions of ¼ L-½ L from the transmitting circuit provided that a length of the signal wire between the transmitting and receiving circuits provided in the signal wire is L. As a result, the signal can be more efficiently transmitted to the transmitting circuit at a high speed.

The first signal-wire drive transistor and the control circuit are preferably placed at positions of ¼ L-½ L from the transmitting circuit provided that a length of the signal wire between the control circuit and another signal-wire drive transistor different to the transmitting circuit of the signal wire is L. As a result, the signal can be more efficiently transmitted to the transmitting circuit at a high speed.

The first signal-wire drive transistor and the control circuit are preferably placed at positions of ¼ L-½ L from the control circuit and another signal-wire drive transistor different to the first signal-wire drive transistor provided that a length of the signal wire between the control circuit and another such signal-wire drive transistor is L. As a result, the signal can be more efficiently transmitted to the transmitting circuit at a high speed.

The electronic device preferably comprises a power-supply switch to which the first power supply is connected. Accordingly, the leak current flow into the electronic device can be cut off during whenever the signal is not transmitted.

The power-supply switch is preferably turned off in the case where a frequency of the signal wire is low. Accordingly, the signal can be transmitted only through the transmitting circuit in the case where a high speed is not demanded in the signal transmission. As a result, any unnecessary leak current flow into the electronic device can be cut off.

The first power supply is preferably a power supply different to the power supply for the transmitting and receiving circuits in the signal wire. Accordingly, when the power supply for the transmitting circuit or the receiving circuit is blocked, the voltage in the signal wire can be retained, and the power consumption of the whole electronic device can be reduced.

A power-supply voltage supplied by the first power supply preferably has a potential equal to that of one of the power-supply voltages of the transmitting circuit and the receiving circuit provided in the signal wire whichever is higher. Accordingly, in the case where the power supply voltages of the transmitting and receiving circuits are different to each other, the signal information can be surely transmitted.

The signal wire is preferably provided between element processors of the reconfigurable logic. Accordingly, the signal wire information can be more speedily transmitted in the case where the respective element processors are capable of the transmission and reception.

The signal wire is preferably provided between element processors of the FPGA logic. Accordingly, the signal wire information can be more speedily transmitted in the case where the respective element processors are capable of the transmission and reception.

The signal wire is preferably provided between processor cores of a multiprocessor. Accordingly, the signal wire information can be more speedily transmitted in the case where the respective processor cores are capable of the transmission and reception.

The signal wire is preferably a bus to which input and output ports of a plurality of memories are commonly connected. Accordingly, the signal wire information can be more speedily transmitted in the case where the respective memories are capable of the transmission and reception.

The signal wire is preferably a bidirectional bus. Accordingly, the signal wire information can be more speedily transmitted in the case where the bus is capable of the transmission and reception.

The signal wire is preferably provided between chips. Accordingly, the signal wire information can be more speedily transmitted in the case where the transmission and reception are made possible between chips.

As described, according to the present invention, the voltage transition in the signal wire can be performed at a high speed, and the circuit area and the power consumption can be reduced in the electronic device capable of amplifying the voltage transition in the signal wire.

The electronic device according to the present invention, in which the power consumed in the signal wire amplification can be lessened and the circuit area can be reduced, is effectively applied to battery-driven products used for an IC card and a mobile product, examples of which are a laptop computer, a mobile telephone, a mobile music player and the like.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 15 is a schematic view of an image display device comprising the electronic device as still another application example of the present preferred embodiments.

DETAILED DESCRIPTION OF THE INVENTION

Figure 1:
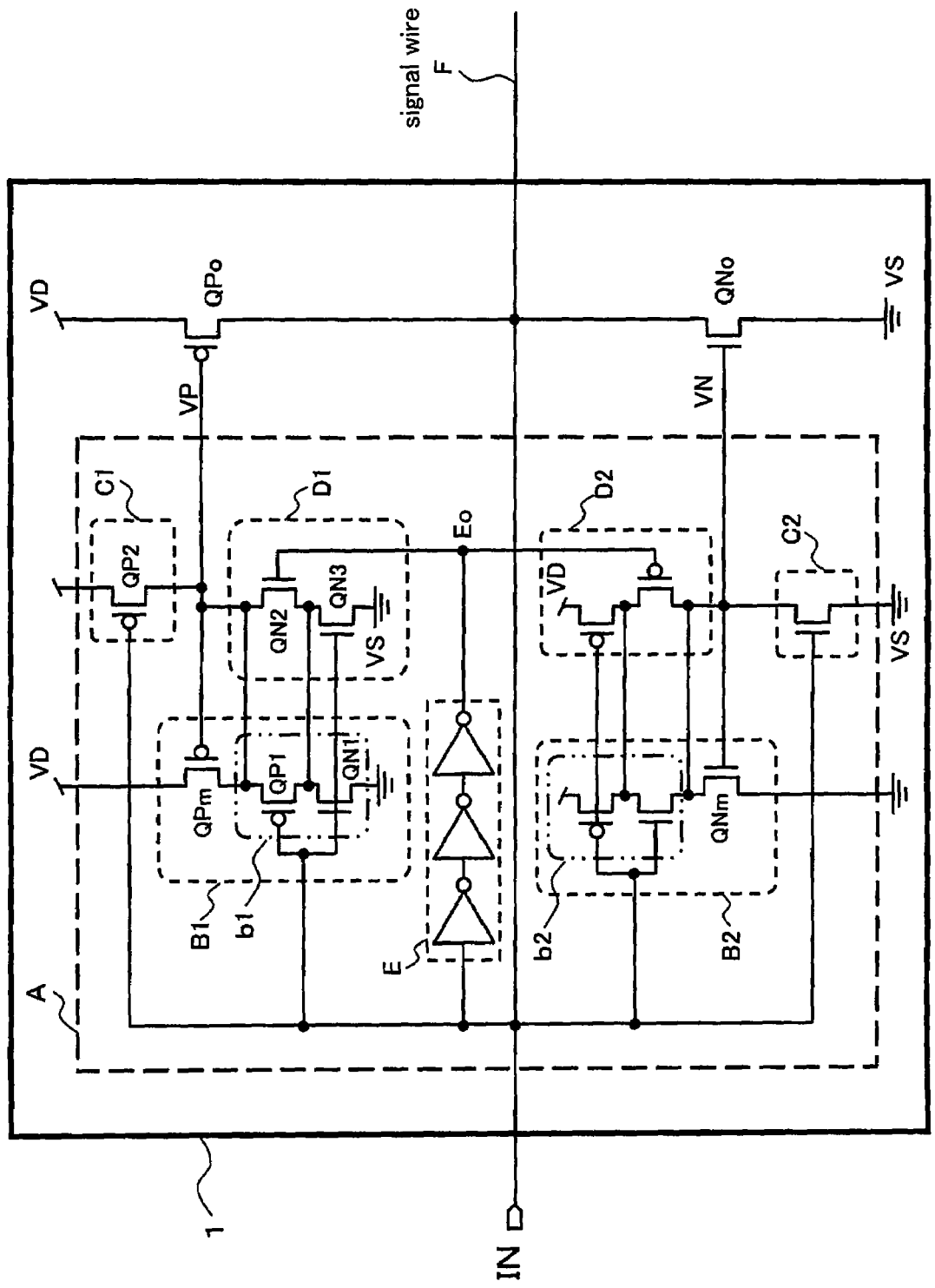
FIG. 1 is a circuit diagram illustrating a constitution of an electronic device according to a preferred embodiment 1 of the present invention.

Hereinafter, preferred embodiments of an electronic device according to the present invention are described in detail referring to the drawings.

PREFERRED EMBODIMENT 1

FIG. 1 is a circuit diagram illustrating a constitution of an electronic device 1 according to a preferred embodiment 1 of the present invention. The electronic device 1 comprises a signal wire F, a first signal-wire drive transistor QPo of the PMOS type, a second signal-wire drive transistor QNo of the NMOS type, and a control circuit A. The first signal-wire drive transistor QPo of the PMOS type and the second signal-wire drive transistor QNo of the NMOS type are opposite in polarity. The control circuit A detects a transition state of the signal wire F to thereby control a gate voltage VP of the first signal-wire drive transistor QPo and a gate voltage VN of the second signal-wire drive transistor QNo.

A source of the first signal-wire drive transistor QPo of the PMOS type is connected to a high-potential-side power supply (first power supply) VD, and a drain thereof is connected to the signal wire F. A source of the second signal-wire drive transistor QNo of the NMOS type is connected to a low-potential-side power supply (second power supply) VS (ground potential 0 [V] in FIG. 1) having a polarity reverse to that of the high-potential-side power supply, and a drain thereof is connected to the signal wire F.

The control circuit A comprises a first voltage retaining circuit B1 and a second voltage retaining circuit B2. The first voltage retaining circuit B1 controls the gate voltage VP of the first signal-wire drive transistor QPo so that a current flowing in the signal F is amplified toward a voltage to which a potential of the signal F transits during the potential transition in the signal wire F, and a voltage value obtained after the potential transition in the signal wire F is retained after the potential transition in the signal wire F.

The second voltage retaining circuit B2 controls the gate voltage VN of the second signal-wire drive transistor QNo so that the current flowing in the signal F is amplified toward the voltage to which the potential of the signal F transits during the potential transition in the signal wire F, and a voltage value obtained after the potential transition in the signal wire F is retained after the potential transition in the signal wire F.

The first voltage retaining circuit B1 comprises a first voltage-retaining MOS transistor QPm of the P-channel type. A gate of the first voltage-retaining MOS transistor QPm is connected to a gate of the first signal-wire drive transistor QPo, and a source of the first voltage-retaining MOS transistor QPm is connected to the high-potential-side power supply VD. The source of the first signal-wire drive transistor QPo is also connected to the high-potential-side power supply VD. The gate and drain of the first voltage-retaining MOS transistor QPm are connected to each other, and the first voltage-retaining MOS transistor QPm thereby has a diode structure. The drain of the first voltage-retaining MOS transistor QPm is connected to one of terminals of a first direct-current-cutting switch circuit b1 controlled by the signal wire F. The other terminal of the first direct-current-cutting switch circuit b1 is connected to the low-potential-side power supply VS having the polarity reverse to that of the high-potential-side power supply VD. The first direct-current-cutting switch circuit b1 comprises two switching MOS transistors QP1 and QN1 which are opposite in polarity. These two switching MOS transistors QP1 and QN1 are serially connected to each other. The switching PMOS transistor QP1 is connected to the drain of the first voltage-retaining MOS transistor QPm. The switching PMOS transistor QP1 has the same polarity as that of the first voltage-retaining MOS transistor QPm. Gates of the switching PMOS transistors QP1 and the switching NMOS transistor QN1 are respectively connected to the signal wire F.

In the control circuit A, the gate of the first signal-wire drive transistor QPo is connected to one of terminals of a first transition-amplifying switch circuit C1 controlled by the signal wire F, and a power supply having the same polarity as that of the high-potential-side power supply VD is connected to the other terminal. The first transition-amplifying switch circuit C1 comprises a switch circuit PMOS transistor QP2 having the same polarity as that of the first signal-wire drive transistor QPo. A gate of the switch-circuit PMOS transistor QP2 is connected to the signal wire F, and a drain of the switch-circuit PMOS transistor QP2 is connected to the gate of the first signal-wire drive transistor QPo.

The control circuit A comprises a first current amplifying circuit D1. The first current amplifying circuit D1 controls the gate voltage VP of the first signal-wire drive transistor QPo during the transition of the potential of the signal wire F so that the current flowing in the signal wire F is amplified toward the voltage to which the potential of the signal wire F transits. The first current amplifying circuit D1 comprises first and second current-amplifying MOS transistors QN2 and QN3. A drain of the first current-amplifying MOS transistor QN2 is connected to the gate of the first signal-wire drive transistor QPo, and a source of the first current-amplifying MOS transistor QN2 is connected to a drain of the second current-amplifying MOS transistor QN3. A source of the second current-amplifying MOS transistor QN3 is connected to the low-potential-side power supply VS having the polarity reverse to that of the high-potential-side power supply VD. A gate of the second current-amplifying MOS transistor QN3 is connected to the signal wire F, and a gate of the first current-amplifying MOS transistor QN2 is connected to an inversion output Eo of a delay circuit E to which a signal is inputted from the signal wire F.

In the control circuit A, the circuit parts which control the gate voltage VN of the second signal-wire drive transistor QNo is the second voltage retaining circuit B2, second current amplifying circuit D2 and second transition-amplifying switch circuit C2. These circuit parts are configured in substantially the same manner as the circuit parts comprising the first voltage retaining circuit B1, first current amplifying circuit D1 and first transition-amplifying switch circuit C1. Therefore, the same and similar components are denoted by the same reference numerals. However, the polarities of the MOS transistors and the power-supply voltages used in the respective circuits are reversed in the respective circuit parts. A reference symbol b2 denotes a direct-current-cutting switch circuit in the second voltage retaining circuit B2.

Figure 2:
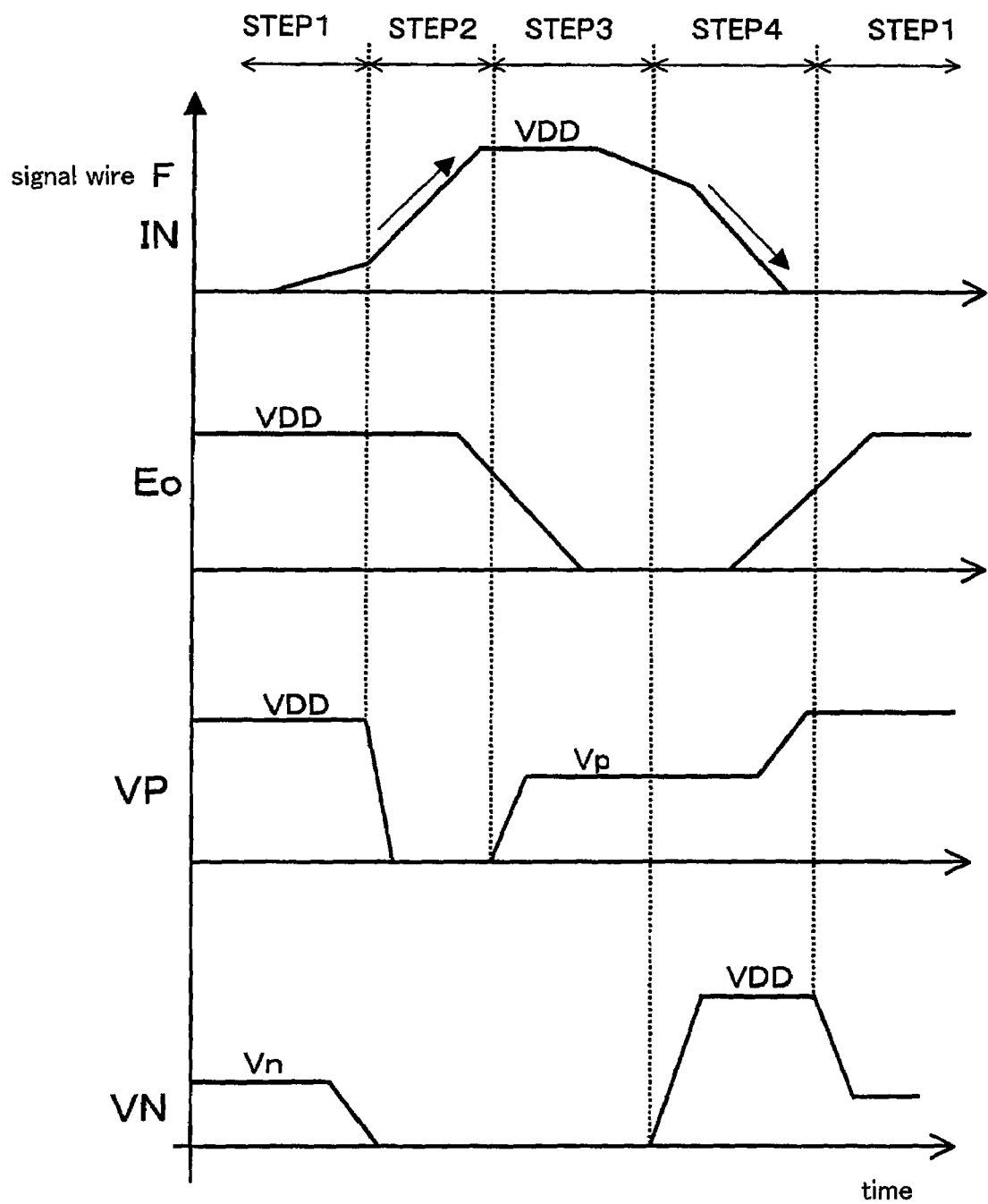
FIG. 2 is a timing chart showing the operation of the electronic device according to the preferred embodiment 1.

FIG. 2 is a timing chart of each node in the electronic device 1. Referring to FIG. 2, the operation of the electronic device 1 is described. In FIG. 2, a horizontal axis denotes time, and a vertical axis denotes the voltage of the signal wire F, inversion output Eo of the delay circuit E, gate voltage VP of the first signal-wire drive transistor QPo, and gate voltage VN of the second signal-wire drive transistor QNo.

Step 1

First, 0 [V] is set in the signal wire F. At the time, the inversion output Eo of the delay circuit E and the gate voltage VP of the first signal-wire drive transistor QPo are substantially equal to a power-supply voltage VDD of the high-potential-side power supply VD. The drain and the gate of the first voltage-retaining MOS transistor QNm of the second voltage retaining circuit B2 are connected to each other; however, there is no power supply from any of the other MOS transistors to the first voltage-retaining MOS transistor QNm in the state of STEP 1. Accordingly, the first voltage-retaining MOS transistor QNm has a diode characteristic. In this state, the gate and the drain of the first voltage-retaining MOS transistor QNm correspond to an anode of the diode. Therefore, the gate voltage VN of the second signal-wire drive transistor QNo shows a voltage value Vn in the vicinity of a threshold value of the first voltage-retaining MOS transistor QNm, and the second signal-wire drive transistor QNo at the time shows the non-saturation current characteristic. Accordingly, in the second signal-wire drive transistor QNo, a weak current starts to flow from the drain to the source, and further to a ground potential connected to the source. The voltage of the signal wire F is thereby retained at 0 [V].

Because the voltage of the signal wire F is retained at 0 [V]:
the switch-circuit PMOS transistor QP2 in the first transition-amplifying switch circuit C1 is in the ON state;
the gate voltage VP of the first signal-wire drive transistor, QPo is retained at the power-supply voltage VDD; and
the first direct-current-cutting switch circuit b1 is in the OFF state.

Further, in the first current amplifying circuit D1, the first current-amplifying MOS transistor QN2 is in the ON state, while the second current-amplifying MOS transistor QN3 is in the OFF state.

Step 2

When the voltage of the signal F thereafter starts to transit from 0 [V] to the power-supply voltage VDD:
the second current-amplifying MOS transistor QN3 of the first current amplifying circuit D1 transits from the OFF state to the ON state;
the gate voltage VP of the first signal-wire drive transistor QPo transits from the power-supply voltage VDD to 0 [V];
the switch-circuit PMOS transistor QP2 of the first transition-amplifying switch circuit C1 transits from the ON state to the OFF state;
the switch-circuit NMOS transistor of the second transition-amplifying switch circuit C2 which is logically inverse to the operation of the switch-circuit PMOS transistor QP2 transits from the OFF state to the ON state; and
the gate voltage VN of the second signal-wire drive transistor QNo transits to 0 [V].

Thereby, the ON operation of the first signal-wire drive transistor QPo and the OFF operation of the second signal-wire drive transistor QNo are powerfully executed. According to the transition, the current flows into the signal F from the first signal-wire drive transistor QPo, and the voltage of the signal wire F is thereby amplified.

Step 3

When the signal F transits to about the power-supply voltage VDD, the inversion output Eo of the delay circuit E transits from the power-supply voltage VDD to 0 [V], and the first current-amplifying MOS transistor QN2 is turned off. As a result, the first current amplifying circuit D1 is cut off. The drain and the gate of the first voltage-retaining MOS transistor QPm of the first voltage retaining circuit B1 are connected to each other; however, there is no current supply to the first voltage-retaining MOS transistor QPm from another MOS transistor in the state of STEP 3. Therefore, the first voltage-retaining MOS transistor QPm has a diode characteristic. In this state, the gate and the drain of the first voltage-retaining MOS transistor QPm correspond to a cathode of the diode. Therefore, the gate voltage VP of the first signal-wire drive transistor QPo is retained at the voltage value Vp which is lower than the power-supply voltage VDD by the threshold voltage of the voltage-retaining MOS transistor QPm, and the first signal-wire drive transistor QPo has a non-saturation current characteristic. As a result, there is generated a weak current flow into the signal wire F from the source via the drain of the first signal-wire drive transistor QPo, and the signal wire F is thereby retained at the power-supply voltage VDD.

Step 4

Next, when the signal wire F starts to transit from the power-supply voltage VDD to 0 [V]:

the second current amplifying circuit D2 transits from the OFF state to the ON state;

the gate voltage VN of the second signal-wire drive transistor QNo transits from 0 [V] to the power-supply voltage VDD;

the switch-circuit PMOS transistor QP2 of the first transition-amplifying switch circuit C1 transits from the OFF state to the ON state; and the gate voltage VP of the first signal-wire drive-transistor QPo transits to the power-supply voltage VDD.

Thereby, the ON operation of the second signal-wire drive transistor QNo and the OFF operation of the first signal-wire drive transistor QPo are powerfully executed. According to the transition, the current flows into the signal F from the second signal-wire drive transistor QNo, and the voltage of the signal wire F is thereby amplified.

(STEP 1) When the signal wire F transits to about 0 [V], each node returns to its initial state.

The characteristics of the electronic device 1 so far described are recited below. In the electronic device 1 according to the present preferred embodiment the number of the serial stages can be one in the first or second signal-wire drive transistors Qo (QPo or QNo) which drives the signal wire F; and the potential of the signal wire F can be retained without the additional provision of a voltage retaining circuit.

As a result, the circuit area and the power consumption can be reduced.

Below is described a reason. When an electronic device 1 is designed, in general, a gate width of the signal-wire drive transistor Qo which flows the current into the signal wire F is designed to be larger than a gate width of another transistor. More specifically, the gate width of the signal-wire drive transistor Qo is configured to be twice or three times as large as the gate width of the other transistors of the electronic device 1. Therefore, in the case where the number of the serial stages in the signal-wire drive transistor Qo is two, the gate width is further doubled, which occupies at least 30% of the transistor size of the electronic device 1.

In the case where the gate width of the signal-wire drive transistor Qo is four, and the gate width of the other transistors is one, a ratio of the gate width of the transistor Qo to the transistor size of the electronic device 1 is 4/(9+4)=30%. In the constitution according to the present preferred embodiment, the ratio is 2/13=15%, which leads to the reduction of the circuit area. The area reduction is as effective as the reduction obtained in the circuit according to the conventional example 1 shown in FIG. 6, the circuit according to the conventional example 2 shown in FIG. 2 and the like.

Further, the gate width of each of the MOS transistors constituting the positive-feedback buffer directly connected to the signal wire F is generally approximately ¼ of that of the signal-wire drive transistor Qo, and the total gate width of all of the MOS transistors roughly amounts to the gate width of the signal-wire drive transistor. Thus, the circuit area of the positive-feedback buffer can also be reduced.

Next, the power reduction effect according to the present preferred embodiment is described. The power consumption of the transistor is generally calculated as follows.

power consumption=½×(gate capacitance)×(frequency of signal wire)×(power-supply voltage)×(amplitude voltage of signal wire)

As shown in the effect of the circuit area reduction described earlier, the gate size of the electronic device 1 according to the present invention is largely reduced, which obviously exerts a remarkable effect in the reduction of the power consumption, a value of which is defined in the foregoing calculation formula.

The voltage of the signal wire F can be amplified only by the first signal-wire drive transistor QPo. In the present invention, the second signal-wire drive transistor QNo is provided in addition to the first signal-wire drive transistor QPo so that the voltage of the signal wire F can be amplified when the voltage of the signal wire F reversely transits.

In the constitution of the first voltage retaining circuit B1 described earlier, the anti-noise performance of the signal wire F can be highly accurately retained irrespective of the variability, in the manufacturing process of the electronic device 1, variation of the power-supply voltage and temperature variation.

Further, since the first voltage-retaining MOS transistor QPm is used in the diode section of the first voltage retaining circuit B1, a mirror-symmetry structure can be realized by the first signal-wire drive transistor QPo and the first voltage-retaining MOS transistor QPm. Therefore, the gate voltage VP of the first signal-wire drive transistor QPo can be highly accurately retained at an arbitrary voltage value irrespective of the variability in the manufacturing process, variation of the power-supply voltage and temperature variation.

Further, the gate and the drain of the first voltage-retaining MOS transistor QPm of the first voltage retaining circuit B1 are connected to each other, and a current mirror circuit is thereby realized by the first voltage-retaining MOS transistor QPm and the first signal-wire drive transistor QPo. Therefore, it is easier to control the gate voltage VP of the first signal-wire drive transistor QPo, and the gate voltage value of the first signal-wire drive transistor QPo can be controlled so that the amount of the current between the source and the drain of the first voltage-retaining MOS transistor QPm shows an arbitrary current ratio.

Further, the drain of the first voltage-retaining MOS transistor QPm of the first voltage retaining circuit B1 is connected to one of the terminals of the first direct-current-cutting switch circuit b1 controlled by the signal wire F, and the other terminal of the first direct-current-cutting switch circuit b1 is connected to the low-potential-side power supply VS having the polarity reverse to that of the high-potential-side power supply VD. Therefore, the voltage value of the drain of the first voltage-retaining MOS transistor QPm can be variably controlled in accordance with the transition state in the signal wire F, which makes it easier to control the gate voltage VP of the first signal-wire drive transistor QPo in the first voltage retaining circuit B1.

Further, the switching MOS transistors QP1 and QN1 which are opposite in polarity and serially connected to each other constitute the first direct-current-cutting switch circuit b1, the switch-circuit PMOS transistor QP1 having the same polarity as that of the first voltage-retaining MOS transistor QPm is connected to the drain of the first voltage-retaining MOS transistor QPm, and the signal wire F is connected to the gates of the switch-circuit PMOS transistor QP1 and the switch-circuit NMOS transistor QN1. Therefore, the drain of the first voltage-retaining MOS transistor QPm is connected to the power supply having the different polarity (power supply VD or power supply VS) only when the potential of the signal wire F transits. As a result, the DC current can be cut off so that the power consumption is reduced.

Further, the gate of the signal-wire drive transistor QPo is connected to one of the terminals of the first transition-amplifying switch circuit C1 controlled by the signal wire F, and the power supply having the same polarity as that of the high-potential-side power supply VD is connected to the other terminal of the first transition-amplifying switch circuit C1. Therefore, control can be performed to determine whether or not the gate voltage VP of the first signal-wire drive transistor QPo is set to the power-supply voltage value in accordance with the transition state in the signal wire F.

Further, the switch-circuit PMOS transistor QP2 having the same polarity as that of the first signal-wire drive transistor QPo constitutes the first transition-amplifying switch circuit C1, the gate of the switch-circuit PMOS transistor QP2 is connected to the signal wire F, and the drain of the switch-circuit PMOS transistor QP2 is connected to the gate of the first signal-wire drive transistor QPo. Therefore, in the case where the power-supply voltage VDD connected to the first signal-wire drive transistor QPo and the potential of the signal wire F are reverse to each other, the gate voltage VP of the first signal-wire drive transistor QPo is equal to the power-supply voltage, and the first signal-wire drive transistor QPo is thereby cut off. As a result, any unnecessary current flow into the signal wire F, which may prevent the voltage transition in the signal wire F, can be avoided, and the power consumption can be thereby reduced.

Further, the first current amplifying circuit D1 of the control circuit A controls the gate voltage VP of the first signal-wire drive transistor QPo so that the current flowing in the signal wire F is amplified toward the voltage to which the potential of the signal wire F transits during the potential transition in the signal wire F. Therefore, the current flows from the first signal-wire drive transistor QPo toward the voltage to which the potential of the signal wire F transits, and a precipitous voltage transition in the signal wire F is made possible.

Further, the first current amplifying circuit D1 comprises the first and second current-amplifying MOS transistors QN2 and QN3, the drain of the first current-amplifying MOS transistor QN2 is connected to the gate of the first signal-wire drive transistor QPo, the source of the first current-amplifying MOS transistor QN2 is connected to the drain of the second current-amplifying MOS transistor QN3, and the source of the second current-amplifying MOS transistor QN3 is connected to the low-potential-side power supply VS having the polarity reverse to that of the high-potential-side power supply VD. Therefore, the gate voltage VP of the first signal-wire drive transistor QPo can be controlled so that it has the potential reverse to that of the source voltage of the first signal-wire drive transistor QPo. As a result, a precipitous voltage transition in the signal wire F is made possible.

Further, the gate of the second current-amplifying MOS transistor QN3 is connected to the signal wire F, and the gate of the first current-amplifying MOS transistor QN2 is connected to the inversion output Eo of the delay circuit E to which the signal is inputted from the signal wire F. Therefore, the gate voltage VP of the first signal-wire drive transistor QPo can be controlled to have the potential reverse to that of the source voltage of the first signal-wire drive transistor QPo only in a certain period of time during which the potential of the signal wire F transits. As a result, a precipitous voltage transition in the signal wire F is made possible, and the leak current of the gate of the first signal-wire drive transistor QPo can be reduced.

Figure 3:
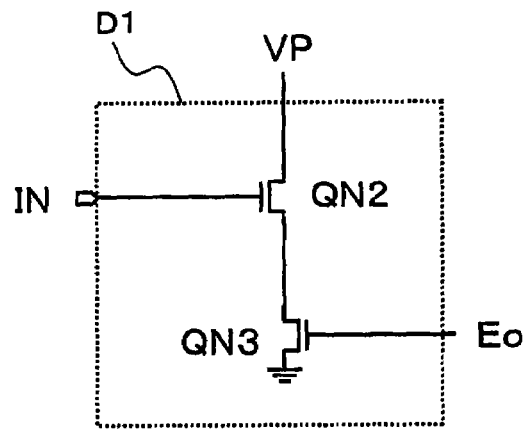
FIG. 3 is a circuit diagram illustrating a constitution of a current amplifying circuit of the electronic device according to the preferred embodiment 1.

Further, as shown in FIG. 3, it is desirable that the gate of the first current-amplifying MOS transistor QN2 be connected to the signal wire F, and the gate of the second current-amplifying MOS transistor QN3 be connected to the inversion output Eo of the delay circuit E to which the signal is inputted from the signal wire F. Accordingly, the gate voltage VP of the first signal-wire drive transistor QPo can be transmitted to the potential reverse to that of the source voltage of the first signal-wire drive transistor QPo via the first current-amplifying MOS transistor QN2 only in a certain time when the voltage of the signal wire F transits from 0V to the power-supply voltage VDD. As a result, a precipitous voltage transition in the signal wire F is made possible, and the leak current of the gate of the first signal-wire drive transistor QPo can be reduced.

Further, the thickness of the gate oxide film of the first voltage-retaining MOS transistor QPm in the first voltage retaining circuit B1 is desirably larger than that of the gate oxide film of the first signal-wire drive transistor QPo. Accordingly, the threshold value of the first voltage-retaining MOS transistor QPm is higher than that of the first signal-wire drive transistor QPo. As a result, it becomes easier to generate the gate voltage value necessary for the current between the source and the drain of the first signal-drive transistor QPo to show the non-saturation current characteristic, and the leak current of the gate of the first voltage-retaining MOS transistor QPm can be reduced.

Further, the threshold value of the first voltage-retaining MOS transistor QPm of the first voltage retaining circuit B1 is desirably higher than that of the first signal-wire drive transistor QPo. Accordingly, the threshold value of the first voltage-retaining MOS transistor QPm is higher than that of the first signal-wire drive transistor QPo. As a result, it becomes easier to generate the gate voltage value necessary for the current which flows between the source and the drain of the first signal-drive transistor QPo to show the non-saturation current characteristic, and the leak current generated between the source and the drain of the first voltage-retaining MOS transistor QPm (sub-threshold) can be reduced.

Further, the gate length of the first voltage-retaining MOS transistor QPm of the first voltage retaining circuit B1 is desirably larger than that of the first signal-wire drive transistor QPo. Accordingly, the threshold value of the first voltage-retaining MOS transistor QPm is higher than that of the first signal-wire drive transistor QPo. As a result, it becomes easier to generate the gate voltage value necessary for the current which flows between the source and the drain of the first signal-drive transistor QPo to show the non-saturation current characteristic, and the leak current generated between the source and the drain of the first voltage-retaining MOS transistor QPm can be reduced.

Further, the gate width of the first voltage-retaining MOS transistor QPm of the first voltage retaining circuit B1 is desirably smaller than that of the first signal-wire drive transistor QPo. Accordingly, the threshold value of the first voltage-retaining MOS transistor QPm is higher than that of the first signal-wire drive transistor QPo. As a result, it becomes easier to generate the gate voltage value necessary for the current which flows between the source and the drain of the first signal-drive transistor QPo to show the non-saturation current characteristic, and the leak current generated between the source and the drain of the first voltage-retaining MOS transistor QPm can be reduced.

Further, the source of the first voltage-retaining MOS transistor QPm of the first voltage retaining circuit B1 is connected to the high-potential-side power supply VD to which the source of the first signal-wire drive transistor QPo is connected. Accordingly, the amount of the current variation of the first signal-wire drive transistor QPo generated by the variation of the power-supply voltage of the electronic device 1 can be monitored. As a result, the gate voltage VP in accordance with the monitored current amount can be applied to the gate of the first signal-wire drive transistor QPo, and the anti-noise performance of the signal wire F can be highly accurately maintained.

Further, the substrate voltage of the first voltage-retaining MOS transistor QPm of the first voltage retaining circuit B1 can be desirably controlled. Accordingly, the amount of the current variation of the first signal-wire drive transistor QPo generated by the variation of the manufacturing process of the electronics device 1 can be compensated in such a manner that the substrate voltage of the first voltage-retaining MOS transistor QPm is controlled. As a result, the gate voltage VP in accordance with the compensated current amount can be applied to the gate of the first signal-wire drive transistor QPo, and the anti-noise performance of the signal wire F can be highly accurately maintained.

Further, the source voltage of the first voltage-retaining MOS transistor QPm of the first voltage retaining circuit B1 can be desirably variably controlled. Accordingly, the amount of the current variation of the first signal-wire drive transistor QPo generated by the variation of the manufacturing process of the electronic device 1 can be compensated in such a manner that the source voltage of the first voltage-retaining MOS transistor QPm is controlled. As a result, the gate voltage VP in accordance with the current amount of the first signal-wire drive transistor QPo can be applied to the gate of the first signal-wire drive transistor QPo, and the anti-noise performance of the signal wire F can be highly accurately maintained.

Further, it is desirable that the first voltage retaining circuit B1 further comprise the second voltage-retaining MOS transistor (not shown), and the source of the first voltage-retaining MOS transistor QPm be connected to the gate and the drain of the second voltage-retaining MOS transistor. Accordingly, the voltage value of the source of the first voltage-retaining MOS transistor QPm shows the voltage value which is different to the voltage value of the source of the second voltage-retaining MOS transistor by the threshold value of the second voltage-retaining MOS transistor. As a result, the gate voltage VP of the first signal-wire drive transistor QPo can be easily controlled so that it has such a value as is necessary for the first signal-wire drive transistor QPo to show the non-saturation region characteristic.

Further, a diode may be used as the first voltage-retaining MOS transistor of the first voltage retaining circuit B1 in place of the transistor. In that case, the well and the diffusion section of the diode, for example, can realize a constitution similar to that of the transistor. Thus constituted, the gate voltage VP of the first signal-wire drive transistor QPo can be controlled under no influence of the manufacturing variation of the gate width of the transistor because the diode has a characteristic different to that of the transistor.

Further, an NMOS transistor may constitute the first voltage-retaining MOS transistor QPm of the first voltage retaining circuit B1 in place of the PMOS transistor. In that case, the gate and the drain of the NMOS transistor are connected to the high-potential-side power supply VD, and the source of the NMOS transistor is connected to the gate of the first signal-wire drive transistor QPo. Accordingly, the NMOS transistor can be a main component in the layout design of the electronic device 1. The NMOS transistor is superior in mobility to the PMOS transistor. Therefore, when the current capacity equal to that of the PMOS transistor can be realized by the NMOS transistor, the transistor width can be reduced, which results in the reduction of the circuit area and the power consumption.

Figure 4:
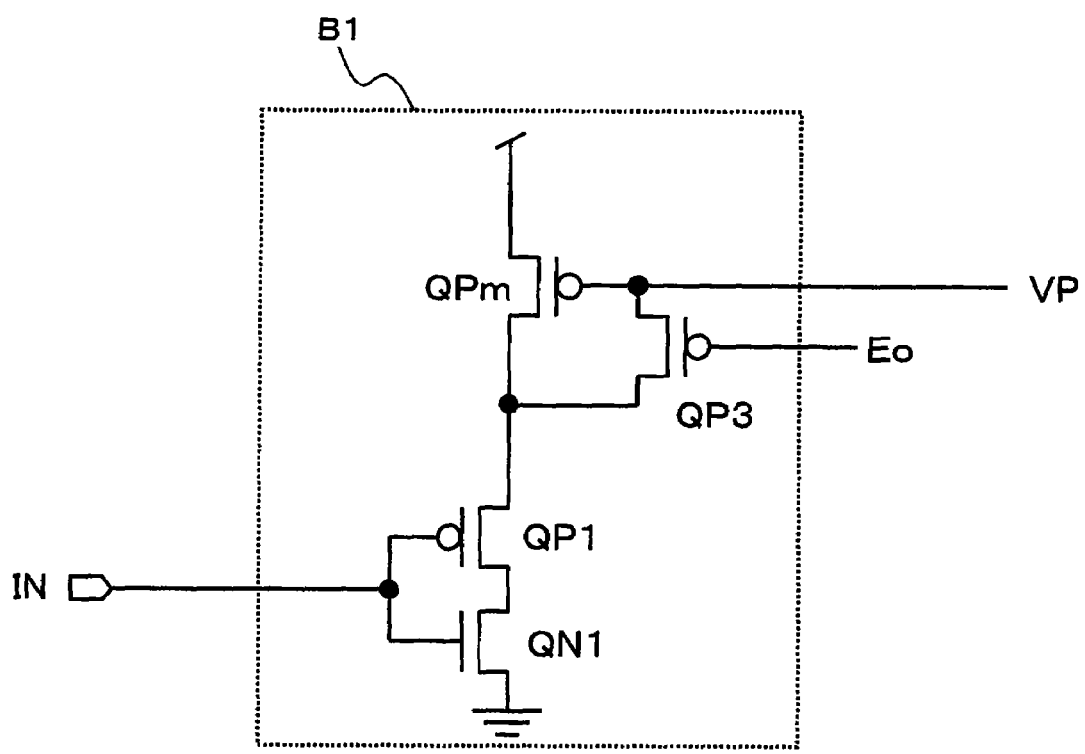
FIG. 4 is a circuit diagram illustrating a constitution of a voltage retaining circuit of the electronic device according to the preferred embodiment 1.

Further, the first voltage retaining circuit B1 may further comprise, as shown in FIG. 4: the DC-cutting MOS transistor QP3 comprising the PMOS transistor, wherein; the drain of the DC-cutting MOS transistor QP3 is connected to the gate of the first voltage-retaining MOS transistor QPm; the source of the DC-cutting MOS transistor QP3 is connected to the drain of the first voltage-retaining MOS transistor QPm; and the gate of the DC-cutting MOS transistor QP3 is connected to the inversion output Eo of the delay circuit E to which the signal from the signal wire F is inputted. Accordingly, the connection state between the gate and the drain of the first voltage-retaining MOS transistor QPm can be controlled by the current mirror circuit comprising the first signal-wire drive transistor QPo and the first voltage-retaining MOS transistor QPm. As a result, the DC current can be cut off, and the power consumption can be thereby reduced. Further, the current mirror circuit (comprising the first signal-wire drive transistor QPo and the first voltage-retaining MOS transistor QPm) can be selectively operated after a certain period of time subsequent to the start of the potential transition of the signal wire F. As a result, the power which is unnecessarily consumed can be reduced, and the transition of the output voltage (VP) of the first current amplifying circuit D1 can be performed at a high speed.

In the constitution according to the present preferred embodiment shown in FIG. 1, the NMOS transistor QN1 of the first voltage retaining circuit B1 and the second current-amplifying MOS transistor QN3 of the first current amplifying circuit D1 are separately provided. However, a single transistor may constitute these transistors QN1 and QN3, wherein an effect similar to that of the present preferred embodiment described above can be obtained, and the circuit area can be further reduced.

Further, the switching PMOS transistor QP1 may be omitted in the first voltage retaining circuit B1. According to the constitution, a small amount of through current may be sacrificed; however, an effect similar to that of the present preferred embodiment described above can be obtained, and the circuit area can be further reduced.

PREFERRED EMBODIMENT 2

Figure 5:
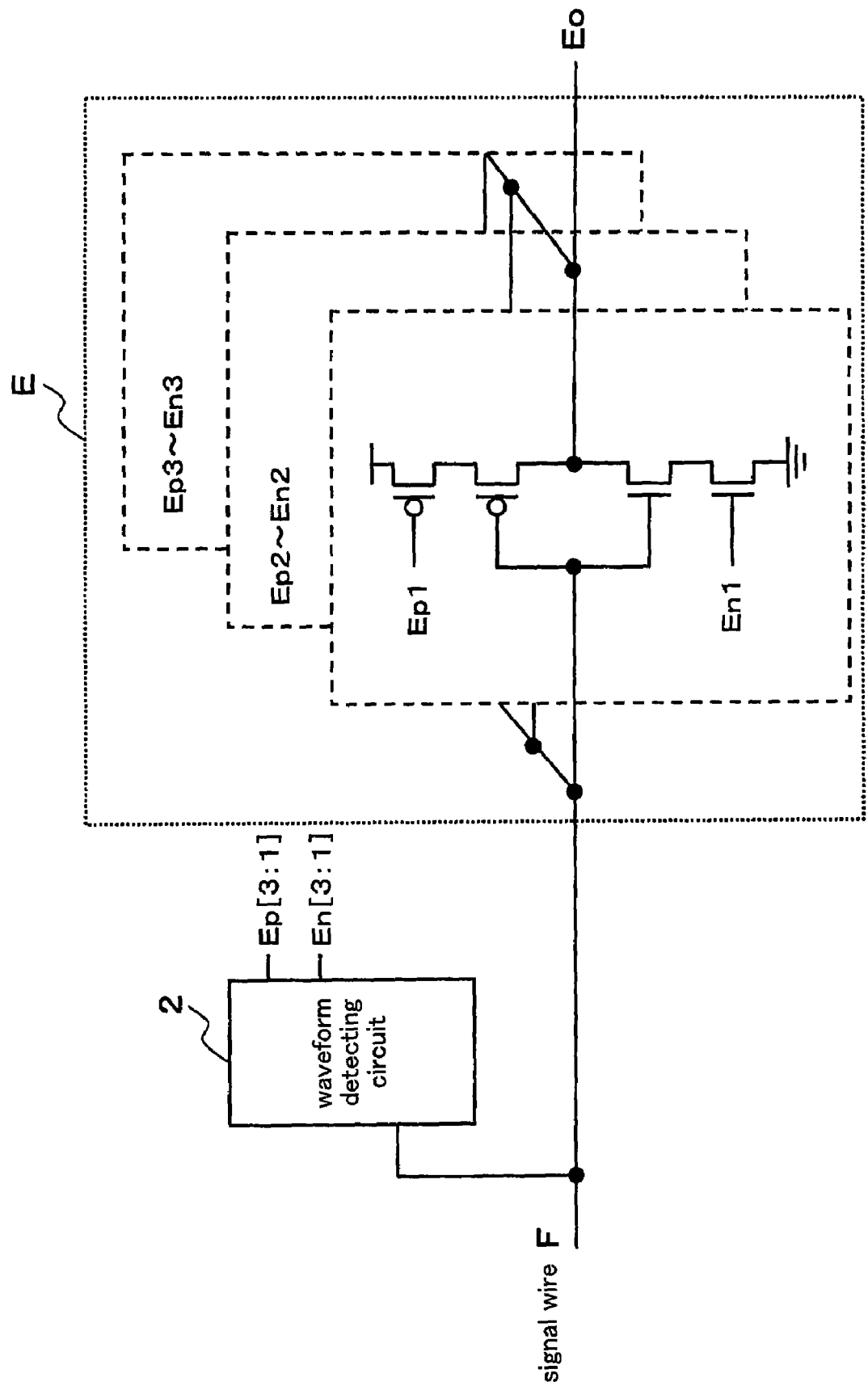
FIG. 5 is a circuit diagram illustrating a constitution of a delay circuit of an electronic device according to a preferred embodiment 2 of the present invention.

FIG. 5 shows another mode of the delay circuit E. The signal wire F is connected to a waveform detecting circuit 2, and tristate inverters En [3:1] and Ep [3:1] of the delay circuit E are controlled based on an output of the waveform detecting circuit 2. The waveform detecting circuit 2 outputs a signal in accordance with a waveform tilt of the signal wire F. In accordance with the output signal of the waveform detecting circuit 2, the delay circuit E controls a delay value thereof. More specifically, the delay value of the delay circuit E is controlled so that it becomes larger as the waveform of the signal wire F is more moderate. In other words, the delay amount by the delay circuit E is variably controlled in accordance with the waveform tilt of the signal wire F. Accordingly, the potential transition time of the signal wire F is highly accurately detected based on the waveform tilt of the signal wire F (slew rate, unit: voltage/time). Then, the gate voltages VP and VN of the signal-wire drive transistors Qo are more reliably controlled based on the detection result of the potential transition time of the signal wire F. As described earlier, the gate voltages VP and VN are controlled so that they have the potential reverse to that of the source voltage of the first signal-wire drive transistor QPo.

As described above, according to the present preferred embodiment, a precipitous voltage transition in the signal wire F is made possible, and the following operation is realized. The operation of controlling the gate voltages VP and VN of the first signal-wire drive transistor QPo can be selectively performed so that they have the potential reverse to that of the source voltage of the first signal-wire drive transistor QPo for a period during which the control is necessary. As a result, the leak current of the gate of the first signal-wire drive transistor QPo can be reduced.

PREFERRED EMBODIMENT 3

Figure 6:
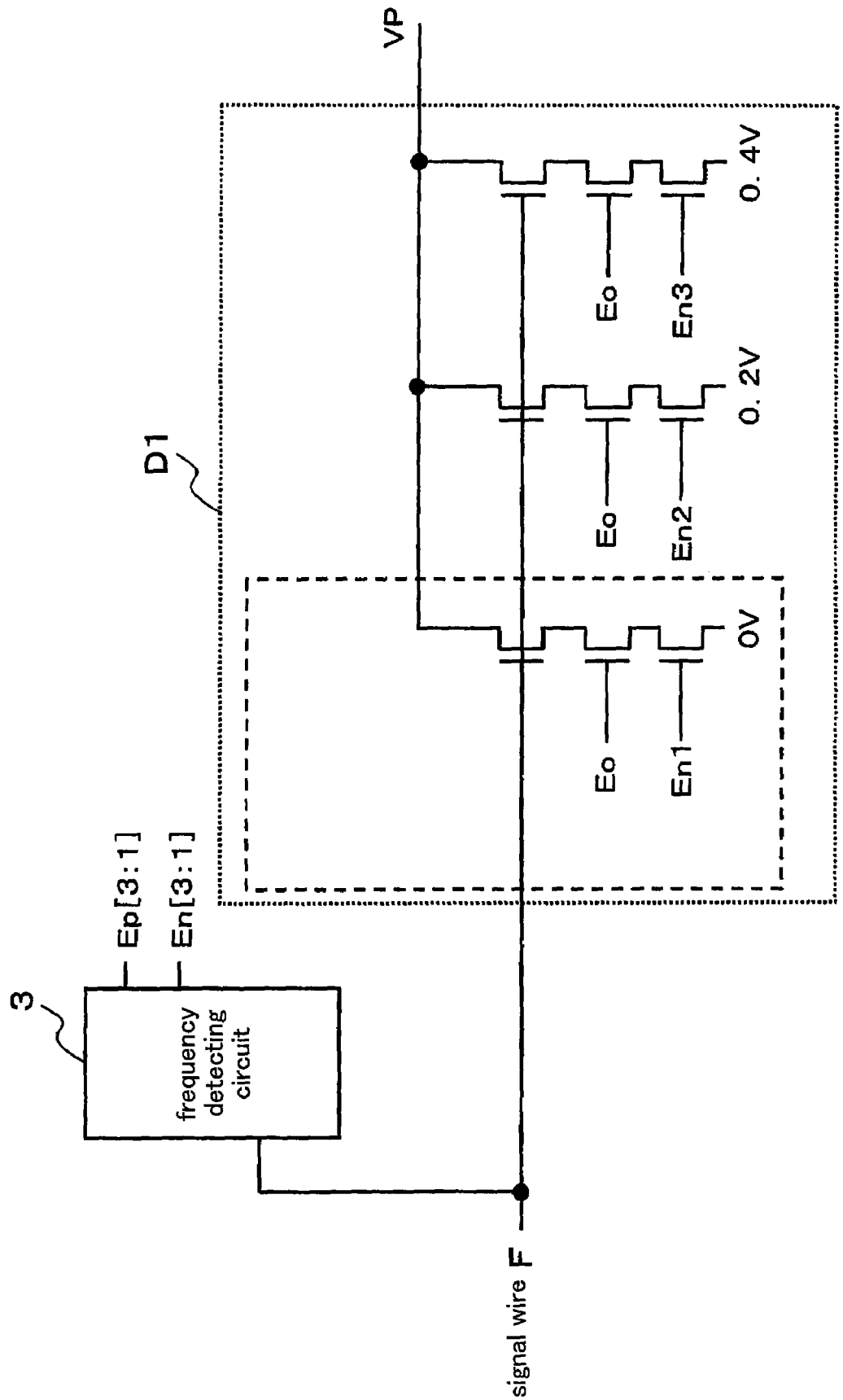
FIG. 6 is a circuit diagram illustrating a constitution of a current amplifying circuit of an electronic device according to a preferred embodiment 3 of the present invention.

FIG. 6 shows another mode of the first current amplifying circuit D1. The signal wire F is connected to a frequency detecting circuit 3. A tristate inverter En [3:1] of the first current amplifying circuit D1 is controlled based on the output of the frequency detecting circuit 3 so that control voltages of the output voltage VP of the first current amplifying circuit D1 (gate voltage of the signal-wire drive transistor QPo) are different to one another (0 [V], 0.2 [V], 0.4 [V]). More specifically, the output voltage VP of the first current amplifying circuit D1 is controlled so that its value is closer to the high-potential side (0.4 [V]) as the cycle of the voltage waveform in the signal wire F is longer (slower), and in other words, the output voltage VP of the first current amplifying circuit D1 is variably controlled in accordance with the cycle of the voltage waveform in the signal wire F. Accordingly, the current capacity of the first signal-wire drive transistor QPo can be adjusted in accordance with cycle of the signal transition, and the power which is unnecessarily consumed can be reduced. The frequency detecting circuit 3 may be provided outside the electronic device 1. In the case where the signal frequency in the signal wire F is previously determined by an application driven by a chip which uses the electronic device 1, the tristate inverter En [3:1] may be controlled by software.

PREFERRED EMBODIMENT 4

Figure 7:
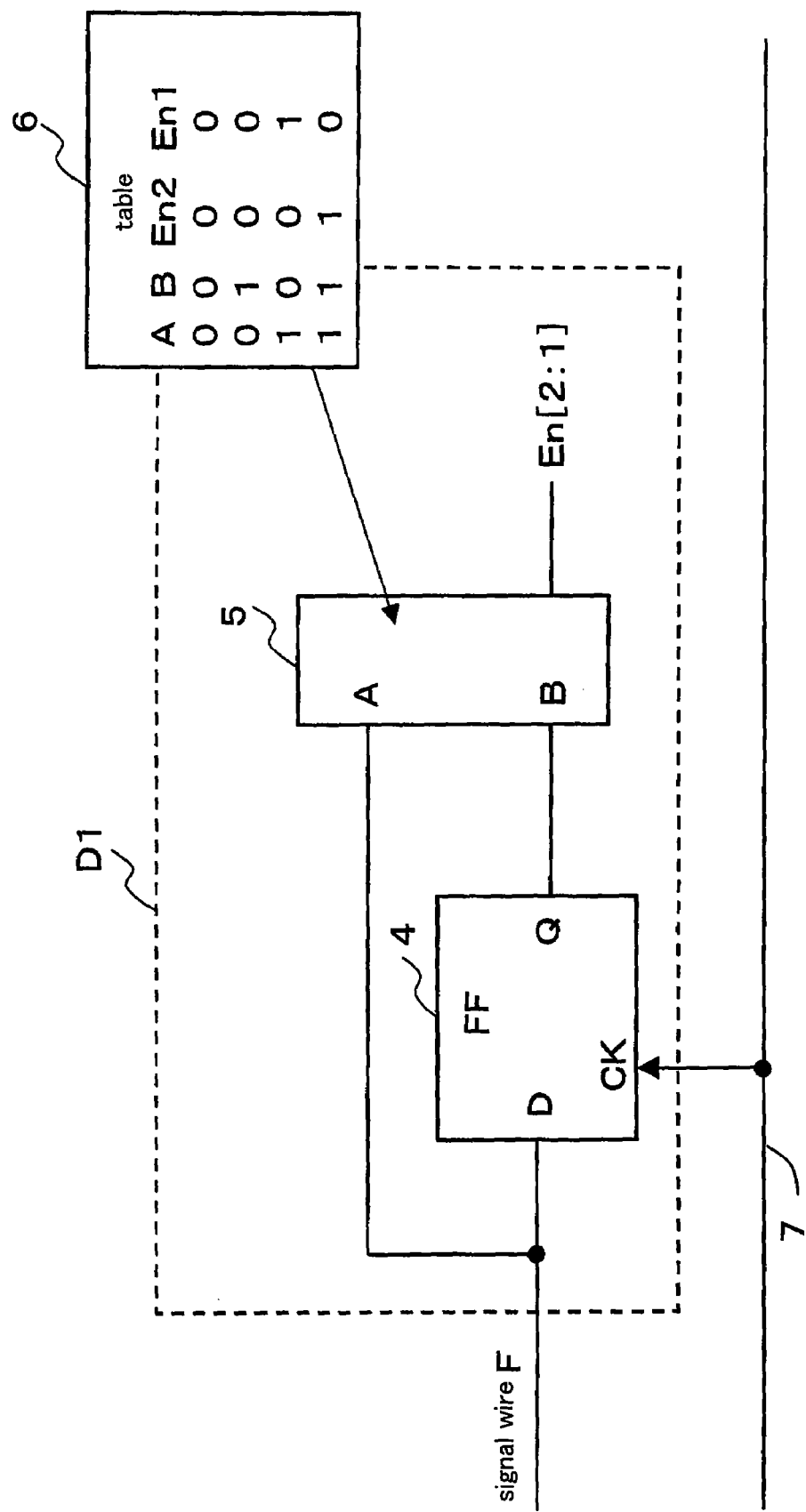
FIG. 7 is a circuit diagram illustrating a constitution of a current amplifying circuit of an electronic device according to a preferred embodiment 4 of the present invention.

FIG. 7 shows still another mode of the first current amplifying circuit D1. The first current amplifying circuit D1 comprises a flip-flop 4 to which the data is inputted from the signal wire F. The flip-flop 4 receives a clock CK from a clock wire 7 synchronizing with and provided along the signal wire F. A logic circuit 5 outputs a control signal En [2:1] in accordance with an immediate value and a previous value of the signal wire F (output Q of the flip-flop) as shown in Table 6. The output voltage of the first current amplifying circuit D1 is variably controlled based on the control signal En [2:1]. Accordingly, the current capacity of the first signal-wire drive transistor QPo is adjusted in accordance with the transition state of the signal wire F, which reduces the power which is unnecessarily consumed. Further, the amplitude of the signal wire F is modulated, and the signal transmission can be thereby more stable.

The flip-flop 4 desirably receives the clock CK from the clock wire 7 synchronizing with and provided along the signal wire F as described earlier. Comparing two constitutions wherein: the flip-flop 4 receives the clock CK from the clock wire 7 synchronizing with the signal wire F and physically shaped in substantially the same manner as the signal wire F, wiring pattern and the like; and the flip-flop 4 receives the clock from a clock wire having a physical shape different to and not provided along the signal wire F, wiring pattern and the like, data transfer errors such as a set-up error and a hold error hardly arise in the case of the former constitution (constitution according to the present preferred embodiment) in comparison to the latter, and the data value of the flip-flop 4 can be more reliably stored. In other words, in the former case, the immediate value and the previous value of the signal wire F can be more reliably utilized so that the signal transmission is stabilized.

PREFERRED EMBODIMENT 5

Figure 8:
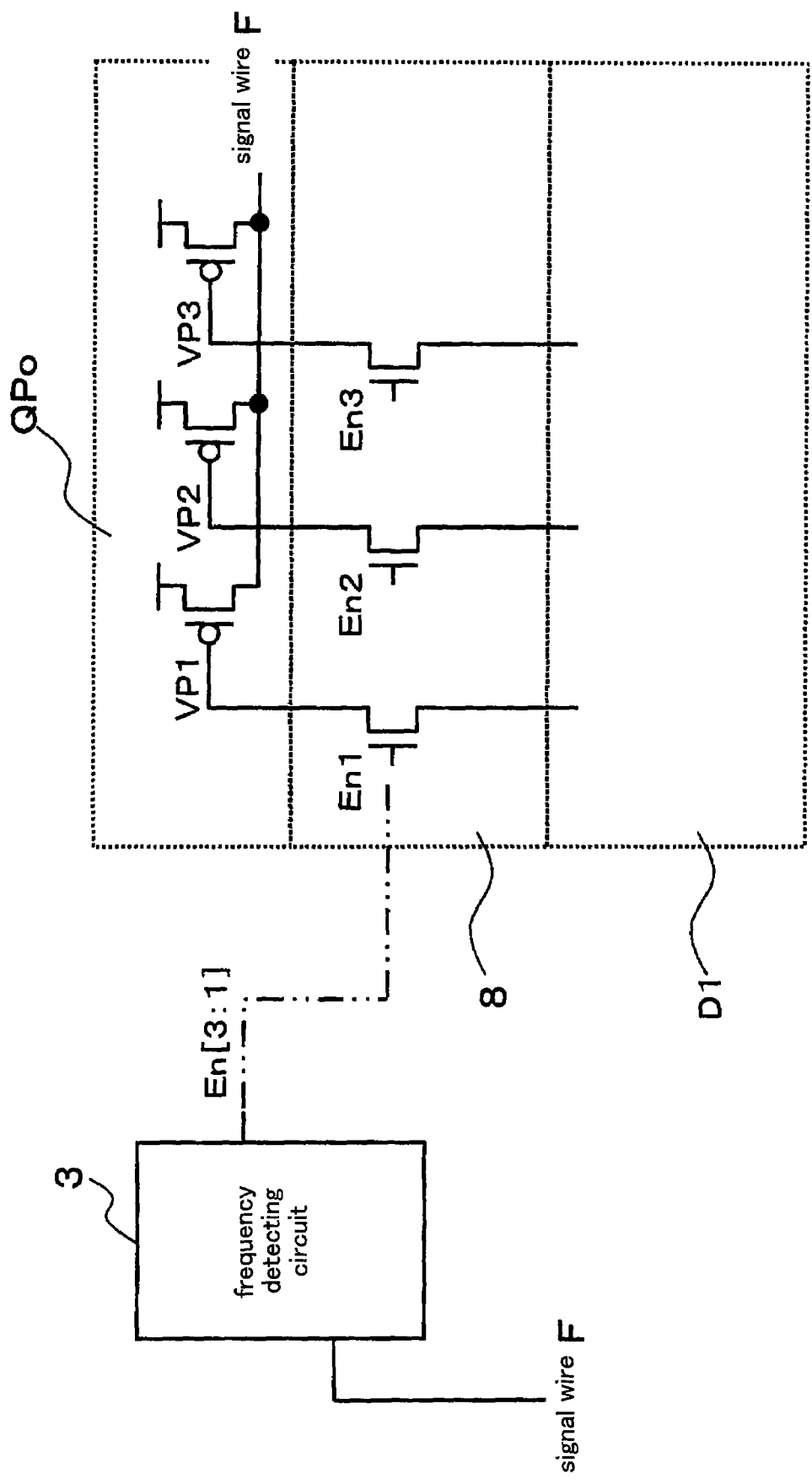
FIG. 8 shows details of a signal-wire drive transistor of an electronic device according to a preferred embodiment 5 of the present invention.

FIG. 8 shows still another mode of the first current amplifying circuit D1. The first current amplifying circuit D1 is provided with a plurality of first signal-wire drive transistors QPo arranged in parallel with each other. Gate voltages VP1, VP2 and VP3 of these first signal-wire drive, transistors QPo are selectively controlled via a selection switch 8 connected to the first current amplifying circuit D1. At the time, the gate voltages VP1, VP2 and VP3 are selectively controlled in accordance with the frequency (cycle) of the voltage waveform in the signal wire F recognized based on the output En [3:1] from the frequency detecting circuit 3. More specifically, when the frequency of the signal wire F is low, the gate voltages VP1, VP2 and VP3 are controlled so that the current capacities of the first signal-wire drive transistors QPo are kept small. Accordingly, the current capacities of the first signal-wire drive transistors QPo can be accurately adjusted, as a result of which the power which is unnecessarily consumed by the gate capacitances of the first signal-wire drive transistors QPo can be reduced.

The gate sizes of the first signal-wire drive transistors QPo can be equal or different to each other. In the case of the gate sizes different to each other, the current capacities of the first signal-wire drive transistors QPo can be variably controlled with a higher resolving power based on the control signal En [3:1].

The first current amplifying circuit D1 according to the preferred embodiment 3 may be combined with the constitution according to the present preferred embodiment. In that case, the current capacities of the first signal-wire drive transistors QPo can be variably controlled with even a higher resolving power.

The respective substrate voltages of the first signal-wire drive transistors QPo may be variably controlled based on frequency detection information. Accordingly, the current capacities of the first signal-wire drive transistors QPo can be variably controlled with even a higher resolving power. In the constitution, the data of the signal wire F can be retained when the respective substrate voltages of the first signal-wire drive transistors QPo are further controlled even when the voltage of the first voltage retaining circuit B1 for retaining the gate voltages VP of the first signal-wire drive transistors QPo is variable and cannot be corrected therein.

The frequency detecting circuit 3 may be provided outside the electronic device 1. In the case where the signal frequency in the signal wire F is previously determined by an application driven by a chip which uses the electronic device 1, the tristate inverter En [3:1] may be controlled by software.

PREFERRED EMBODIMENT 6

Figure 9:
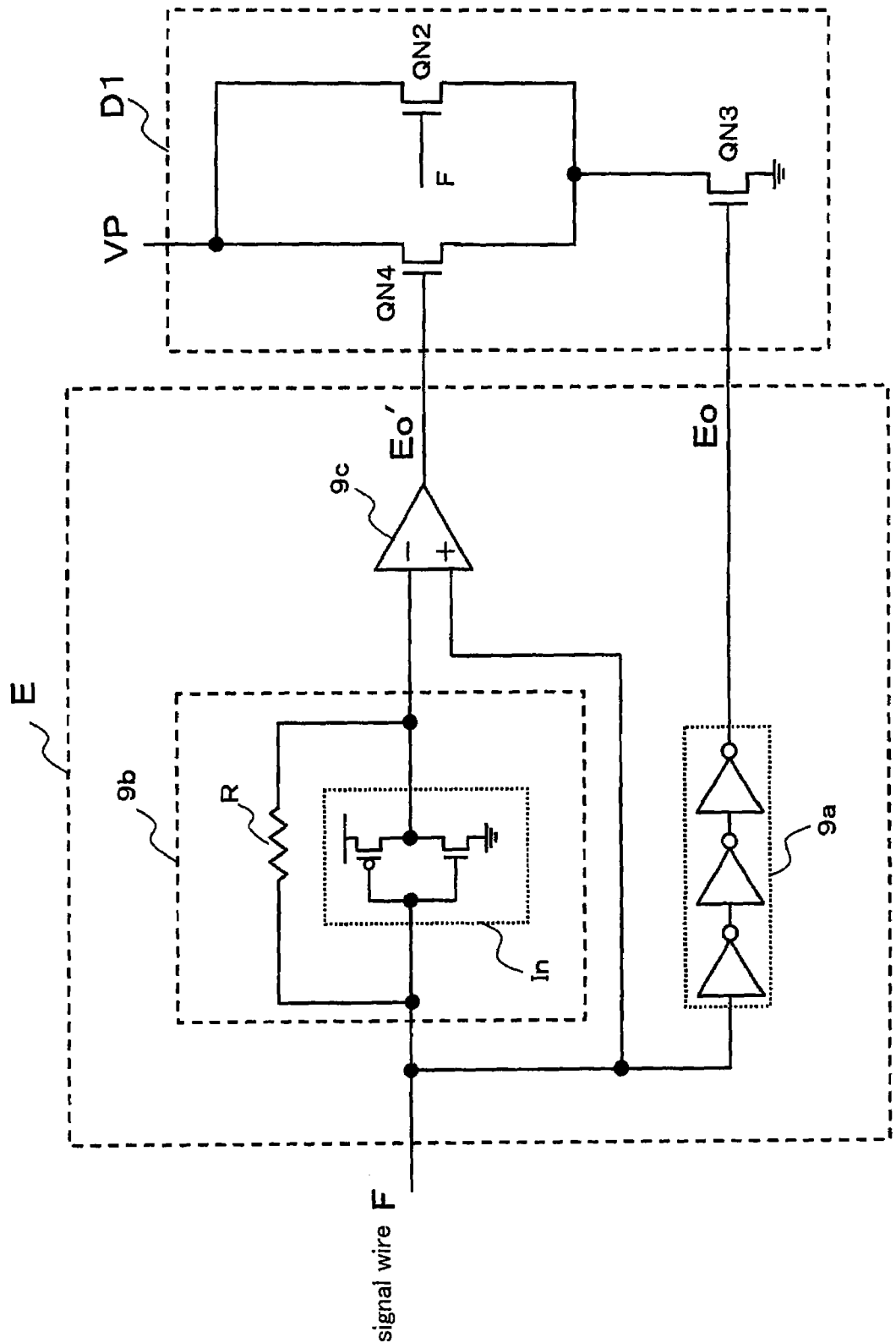
FIG. 9 is a circuit diagram illustrating a constitution of a delay circuit and a current amplifying circuit of an electronic device according to a preferred embodiment 6 of the present invention.

FIG. 9 shows still another mode of the delay circuit E. The delay circuit E comprises an inverter chain circuit 9a, a terminal resistance circuit 9b, and a differential circuit 9c to which the outputs of the signal wire F and the terminal resistance circuit 9b are inputted. A normal-rotation output of the differential circuit 9c corresponds to an inversion output Eo' of the delay circuit E. In addition to the circuit configuration shown in the preferred embodiment 1, in the current amplifying circuit D1, a bypass MOS transistor QN4 of the N-channel type is connected in parallel to the first current-amplifying MOS transistor QN2, and a gate of the bypass MOS transistor QN4 is connected to the inversion output Eo' of the delay circuit E.

Figure 10:
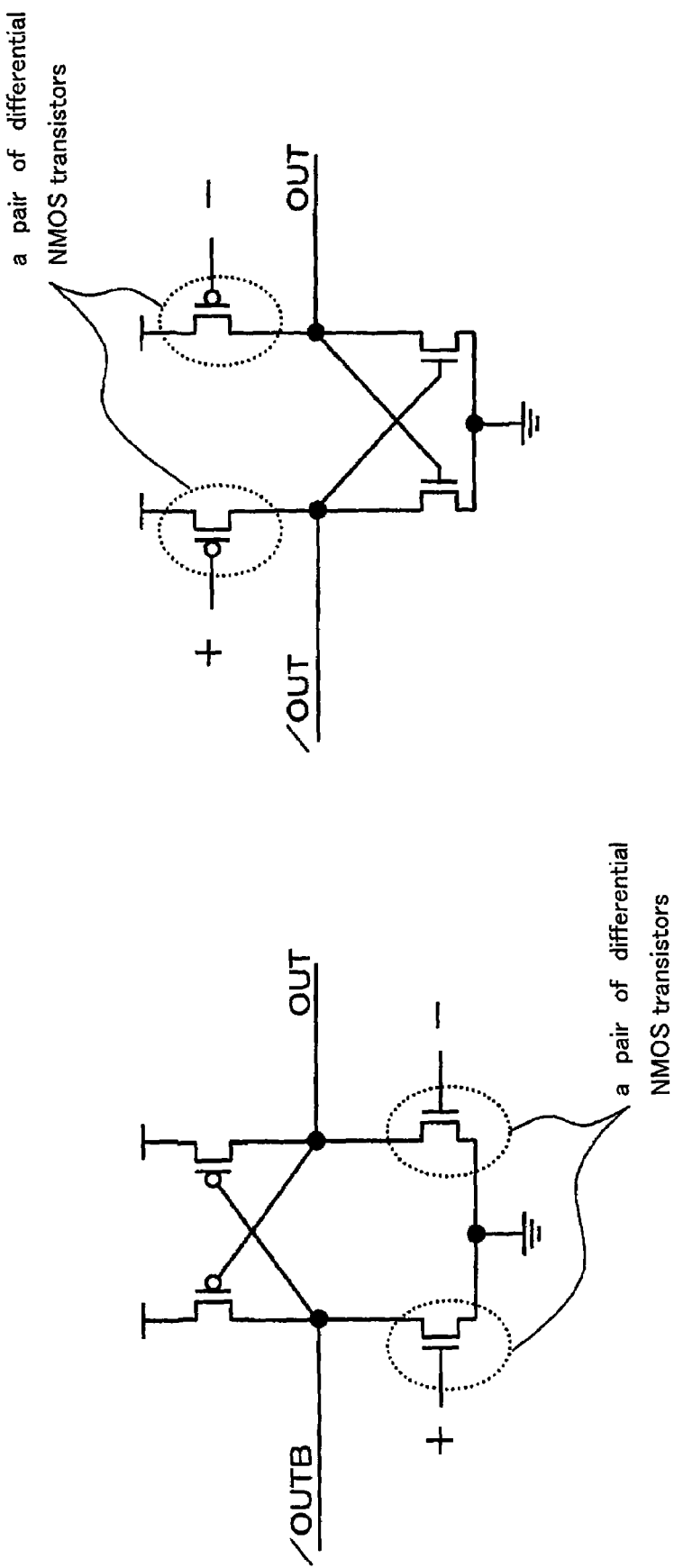
FIG. 10A is a circuit diagram illustrating a constitution 1 of a differential circuit in the delay circuit of the electronic device according to the preferred embodiment 6.
FIG. 10B is a circuit diagram illustrating a constitution 2 of the differential circuit in the delay circuit of the electronic device according to the preferred embodiment 6.

A resistance element R and an inverter In, which are connected in parallel to each other, constitutes the terminal resistance circuit 9b. A pair of differential MOS transistors, examples of which are shown in FIGS. 10A and 10B, constitutes the differential circuit 9c. A node/output signal shown in FIGS. 10A and 10B denotes the normal-rotation output of the differential circuit 9c, and an output signal/node shown therein denotes the inversion output of the differential circuit 9c. The differential circuit 9c voltage-amplifies a small or low voltage difference in the signal wire F at a high speed. Any differential circuit having a circuit configuration other than those shown in FIGS. 10A and 10B may be used as far as the differential circuit is provided with the voltage-amplifying function.

As the inversion output of the differential circuit 9c, the inversion output Eo of the delay circuit E may be used in place of the output of the inverter chain circuit 9a. Accordingly, it becomes unnecessary to provide the inverter chain circuit 9a. As a result, the following effects can be obtained:
the circuit area can be reduced; and
when the signal is transmitted by the signal wire F at a high speed, the signal can be followed by the first current amplifying circuit D1, which stabilizes the operation of the electronic device 1.

The voltage of the signal wire F is inversely amplified by a few tens times by the terminal resistance circuit 9b and transmitted from the terminal resistance circuit 9b to the differential circuit 9c. Therefore, the voltage of the output signal Eo' of the differential circuit 9c transits to the power-supply voltage VDD in accordance with any minor voltage amplitude of the signal wire F, and the bypass MOS transistor QN4 generates a large volume of current. Then, the output voltage VP of the first current amplifying circuit D1 can momentarily transit to 0V. In the first current amplifying circuit D1 according to the preferred embodiment 1, the output voltage VP only slowly transits to 0V because the output voltage VP of the first current amplifying circuit D1 determines the current capacity of the first current-amplifying MOS transistor QN2 by the voltage transition in the signal wire F. In the first current amplifying circuit D1 according to the present preferred embodiment, the output voltage VP of the first current amplifying circuit D1 speedily transits to 0V. Accordingly, any minor voltage transition in the signal wire F can be detected, and the detection result can be transmitted to the first current amplifying circuit D1 so that the current of the first signal-wire drive transistor QPo can be amplified. As a result, the voltage transition in the signal wire F can achieve a high speed.

The resistance element R alone may constitute the terminal resistance circuit 9b. In such a case, the voltage transition in the output signal Eo' of the differential circuit 9c cannot achieve a high speed; however, the power consumption of the inverter In and the circuit area can be reduced.

In place of the output of the terminal resistance circuit 9b, the gate voltage VP of the signal-wire drive transistor QNo having the polarity reverse to that of the signal wire F or the like may be inputted to a minus input terminal of the differential circuit 9c. The voltage value of the input signals of on one side of the differential circuit 9c is different to the voltage value to which the potential of the gate voltage transits by only a few hundred mV. Therefore, when the gate voltage VN of the signal-wire drive transistor QNo is inputted to the minus input terminal of the differential circuit 9c, the differential circuit 9c can detect the voltage transition of the signal wire F at a high speed, and can transmit the detection result to the first amplifying circuit D1. As a result, the voltage transition in the signal wire F can achieve a high speed.

PREFERRED EMBODIMENT 7

Figure 11:
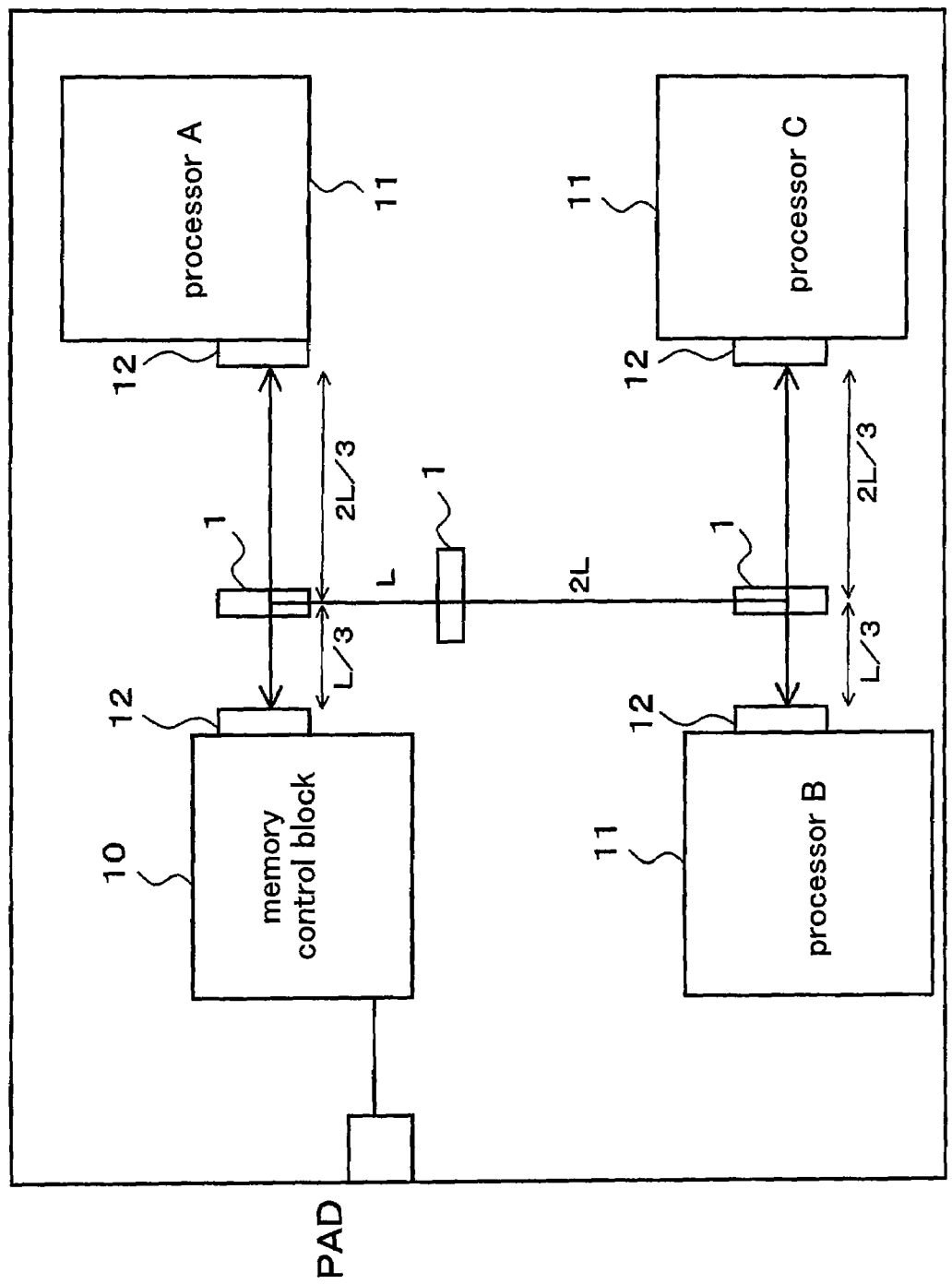
FIG. 11 is a schematic view of a chip comprising an electronic device according to a preferred embodiment 7 of the present invention.

FIG. 11 is a layout drawing of a chip comprising the semiconductor integrated circuits of the electronic device 1. The chip comprises a memory control block 10 for interfacing data input and output from PAD and processor blocks 11 for communicating the data with the memory control block 10. The respective blocks communicate the data via transmitting and receiving circuits 12, and the electronic device 1 is provided between the transmitting and receiving circuits 12. Provided that a wiring distance from the transmitting circuit to the receiving circuit is L, the data signal can be transmitted at a highest speed in the case where the electronic device 1 according to the present preferred embodiment is provided at a position approximately ⅓ L from the transmitting circuit. Below is given a description.

When the wiring distance 1 is divided by 10, and each resistance in the divided wiring is R and the wiring capacitance is C, a transition time t is as follows when the signal voltage of each node from the transmission (an arbitrary point in the ten-divided points is N) is VDD_H.

$$t = (\Sigma I \times R \times C) \times \ln(VDD/VDD\_H) \quad (1)$$

($\Sigma$ is N based on I=1, and ln is logarithm)

For example, the transition time t when the signal voltage from the transmission to the reception is 0.5 VDD is as follows.

$$t = (10RC + 9RC + 8RC + 7RC + 6RC + 5RC + 4RC + 3RC + 2RC + 1RC) \times \ln(VDD/0.5VDD) = 55RC \times \ln 2 = 38RC$$

The electronic device 1 is a circuit for amplifying the voltage of the signal wire F. Therefore, it is the most effective to insert the electronic device 1 at a section in the signal wire F which shows the signal transition immediately before the attenuation and saturation of a voltage amplification factor when the voltage reaches half a value of the power-supply voltage, which can be comprehended through the SPICE simulation, and also comprehended when the voltage amplification factor in each node is calculated in the foregoing formula 1) and subjected to the time-differentiation. More specifically, an optimum point where the electronic device 1 should be inserted in view of each node resulting from the division of the signal wiring by 10 is the third node from the transmitting circuit. When another electronic device 1 is inserted between the respective electronic devices 1, the optimum point for the insertion can be figured out in a similar manner. Accordingly, the voltage transition of the signal transmitted from the transmitting circuit can achieve a high speed, and the signal can be thereby transmitted to the transmitting circuit at a high speed.

Below are compared a constitution wherein the electronic device 1 is provided at a position ¼ L-½ L from the transmitting circuit (L is a signal-wire length between the transmitting and receiving circuits in the signal wire F) from the transmitting circuit and a constitution wherein the electronic device 1 is provided at a position ⅓ L from the transmitting circuit depending on the convenience of physical arrangements. In the former constitution, the signal transition time slightly deteriorates in comparison to the latter constitution; however, the signal transition time is not so affected as in the case where the electronic device 1 is inserted at any other position. This is also applied to the insertion of another electronic device 1 between the electronic devices 1.

The high-potential-side power supply VD and the low-potential-side power supply VS of the electronic device 1 may be connected to a power-supply switch. As a result, the leak current flow in the electronic device 1 can be cut off whenever the signal is not transmitted.

The power-supply switch may be turned off when the frequency of the signal wire F is low. Accordingly, the signal can be transmitted only in the transmitting circuit in the case a high speed is not expected in the signal transmission. As a result, the leak current which is unnecessarily generated in the electronic device 1 can be cut off.

The high-potential-side power supply VD and the low-potential-side power supply VS of the electronic device 1 may be connected to a power-supply switch different to the power supplies in the transmitting and receiving circuits. As a result, the voltage of the signal wire F can be maintained though the power supply of the transmitting circuit or the receiving circuit is turned off, and the power consumption of the whole chip can be thereby reduced.

The high-potential-side power supply VD and the low-potential-side power supply VS of the electronic device 1 desirably have the same potential as that of one of the power-supply voltages of the transmitting circuit and the power-supply voltage of the receiving circuit, whichever has a higher voltage. Accordingly, the signal information can be reliably transmitted though the power-supply voltages of the transmitting and receiving circuits are different to each other. Further, the circuit area can be further reduced in the case where the voltage of the transmitting circuit is relatively low and the power-supply voltage of the receiving circuit is relatively high, because it is unnecessary to provide such a circuit that level shifts the signal voltage in the receiving circuit.

The electronic device 1 may be provided in the wiring between element processors (PE) of the reconfigurable logic. As a result, the signal-wire information can be more speedily transmitted in the case where the element processors are capable of transmission and reception.

The electronic device 1 may be provided in the wiring between element processors of the FPGA logic. As a result, the signal-wire information can be more speedily transmitted in the case where the element processors are capable of transmission and reception.

The electronic device 1 may be provided in the wiring between processor cores of a multiprocessor. As a result, the signal-wire information can be more speedily transmitted in the case where the cores are capable of transmission and reception.

The electronic device 1 may be provided in a bus to which input and output ports of a plurality of memories are commonly connected. As a result, the signal-wire information can be more speedily transmitted in the case where the memories are capable of transmission and reception.

The electronic device 1 may be provided in a bidirectional bus. As a result, the signal-wire information can be more speedily transmitted in the case where the bus is capable of transmission and reception.

Figure 12:
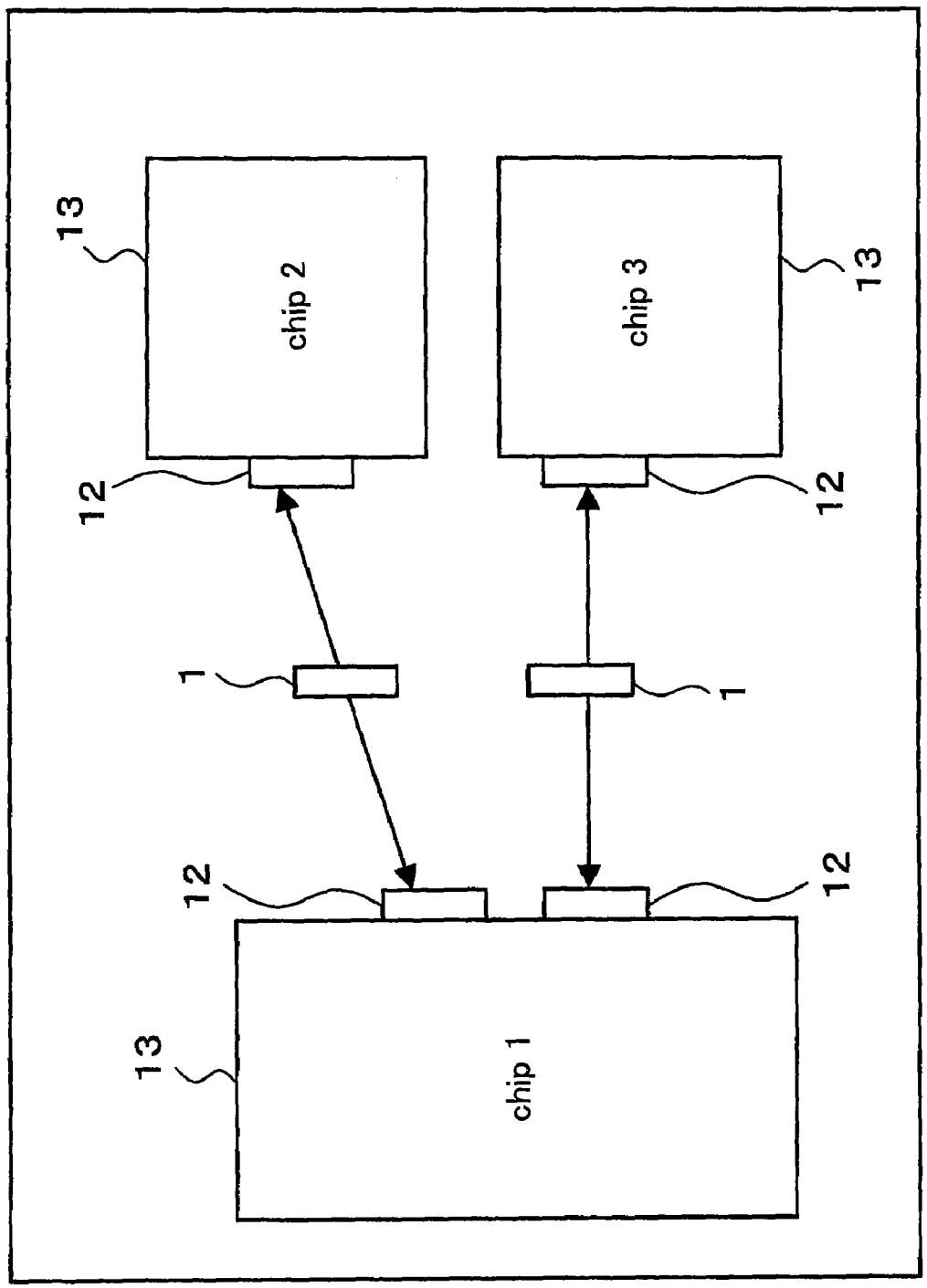
FIG. 12 is a schematic view of chips each comprising the electronic device according to the preferred embodiment 7 of the present invention.

The electronic device 1 may be provided between chips, which is shown in FIG. 12. The electronic device 1 is provided between chips 1-3. As a result, the signal-wire information can be more speedily transmitted in the case where the inter-chip transmission and reception is realized.

Application Examples of the Preferred Embodiments

Figure 13:
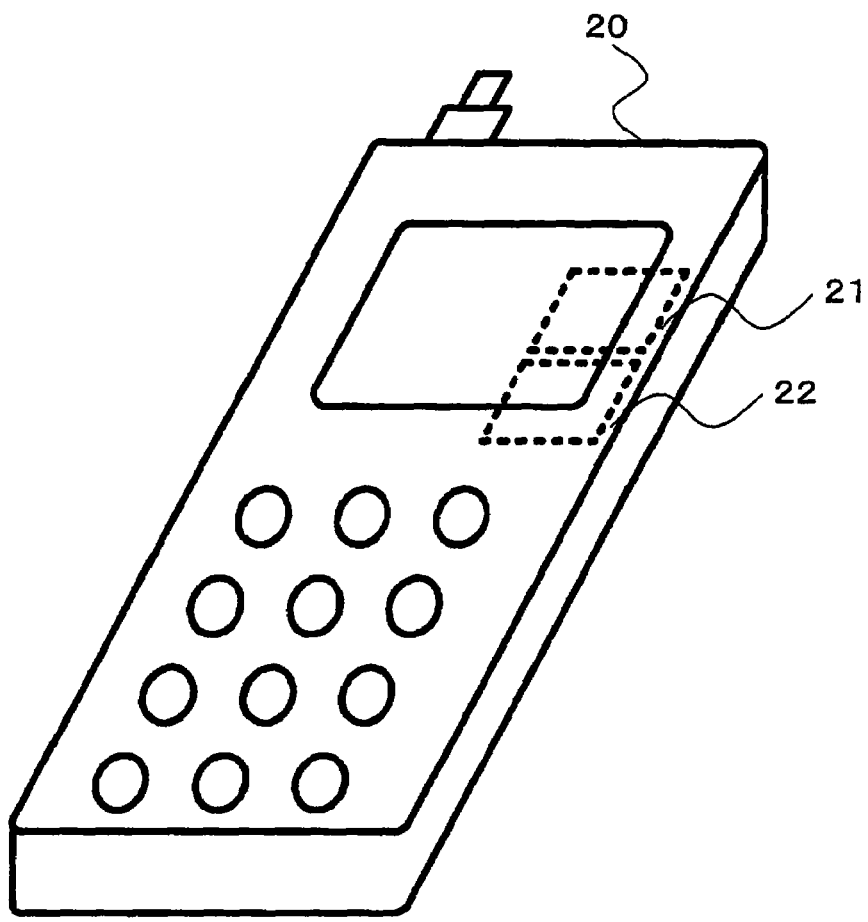
FIG. 13 is a schematic view of a communication device comprising the electronic device as an application example of the present preferred embodiments.

FIG. 13 is a schematic view of a communication device comprising the electronic device according to the present preferred embodiments. A mobile telephone 20 comprises a base band LSI 21 and an application LSI 22. The base band LSI 21 and the application LSI 22 are semiconductor integrated circuits in which the electronic device 1 according to the present preferred embodiments is provided. Because the electronic device 1 is operable with less power than in the conventional technology, the low-power operation can also be realized in the base band LSI 21, application LSI 22 and mobile telephone 20 comprising these components. Further, in the case where the electronic device 1 constitutes a logic circuit provided in any semiconductor integrated circuit provided in the mobile telephone 20, other than the base band LSI 21 and the application LSI 22, a similar effect can be obtained.

The communication device comprising the electronic device 1 should not be limited to the mobile telephone, and may include a transmitter and a receiver, a modem device for the data transfer in the communication system, and the like. According to the present invention, the power consumption can be effectively reduced in any communication device irrespective of cable or radio communication, optical or electric communication, and digital system or analogue system.

Figure 14:
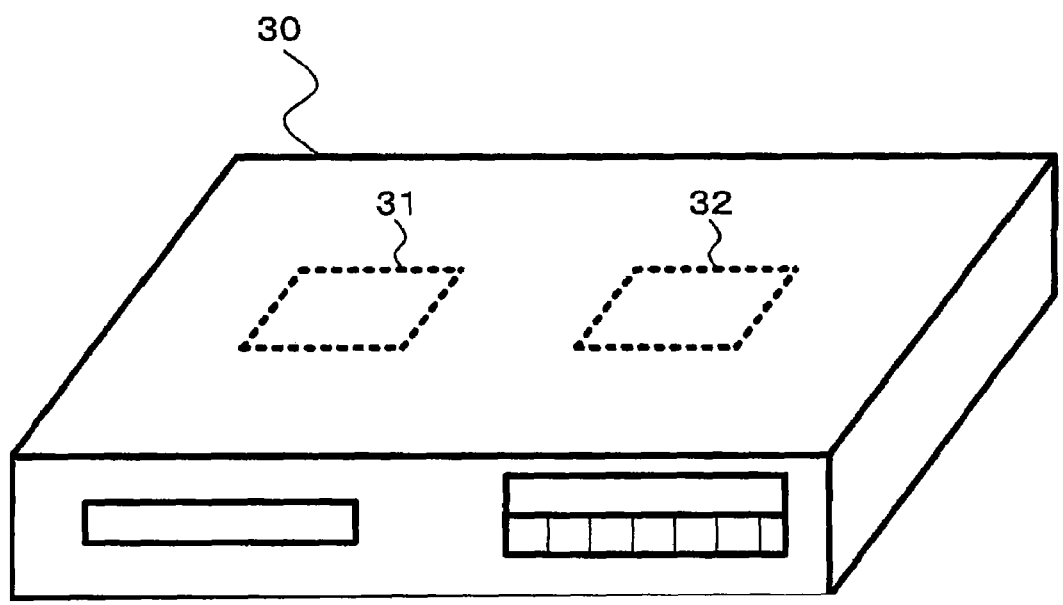
FIG. 14 is a schematic view of an information reproducing device comprising the electronic device as another application example of the present preferred embodiments.

FIG. 14 is a schematic view of an information reproducing device comprising the electronic device 1. An optical disc device 30 comprises a medium signal processor LSI 31 for processing a signal read from an optical disc, and an error correction/servo processor LSI 32 for correcting an error in the signal and servo-controlling an optical pickup. The medium signal processor LSI 31 and the error correction/servo processor LSI 32 are semiconductor integrated circuits in which the electronic device 1 according to the present preferred embodiments is provided. Because the electronic device 1 is operable with less power than in the conventional technology, the low-power operation is also realized in the medium signal processor LSI 31, error correction/servo processor LSI 32 and optical disc device 30 comprising these components. Further, in the case where the electronic device 1 constitutes a logic circuit provided in any semiconductor integrated circuit provided in the optical disc device 30, other than the medium signal processor LSI 31 and the error correction/servo processor LSI 32, a similar effect can be obtained.

The information reproducing device comprising the electronic device 1 should not be limited to the optical disc device, and may include an image recording/reproducing device in which a magnetic disc is incorporated, an information recording/reproducing device in which a semiconductor memory is used as a medium, and the like. According to the present invention, the power consumption can be effectively reduced in any information reproducing device (may include an information recording function) irrespective of whether or not information is recorded in the medium.

FIG. 15 is a schematic view of an image display device comprising the electronic device 1. A television receiver 40 comprises an image/audio processor LSI 41 for processing an image signal and an audio signal, and a display/sound source controller LSI 42 for controlling devices such as a display screen and a speaker. The image/audio processor LSI 41 and the display/sound source controller LSI 42 are semiconductor integrated circuits in which the electronic device 1 according to the present preferred embodiments is provided. Because the electronic device 1 is operable with less power than in the conventional technology, the low-power operation is also realized in the image/audio processor LSI 41, display/sound source controller LSI 42 and television receiver 40 comprising these components. Further, in the case where the electronic device 1 constitutes a logic circuit provided in any semiconductor integrated circuit provided in the television receiver 40, other than the image/audio processor LSI 41 and the display/sound source controller LSI 42, a similar effect can be obtained.

The image display device comprising the electronic device 1 should not be limited to the television receiver, and may include a device for displaying, for example, streaming data distributed via an electric communication wire. According to the present invention, the power consumption can be effectively reduced in any image display device irrespective of an information transmitting method.

Figure 16:
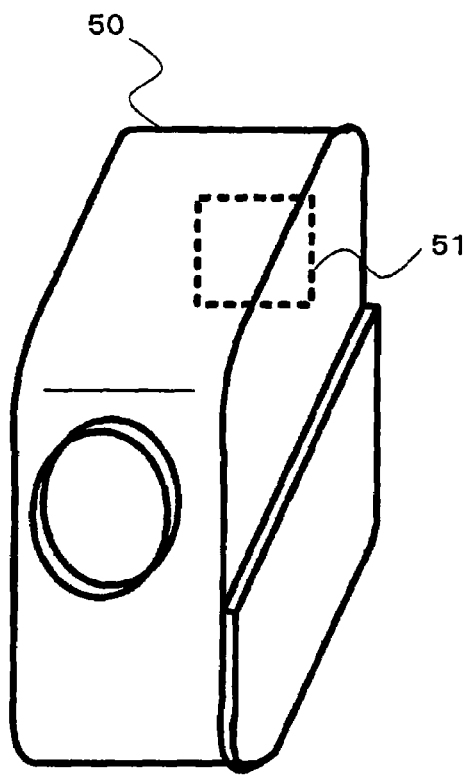
FIG. 16 is a schematic view of an imaging device comprising the electronic device as still another application example of the present preferred embodiment.

FIG. 16 is a schematic view of an imaging device comprising the electronic device 1. A digital camera 50 comprises a signal processor LSI 51 which is a semiconductor integrated circuit comprising the electronic device 1 according to the present invention. Because the electronic device 1 is operable with less power than in the conventional technology, the low-power operation is also realized in the signal processor LSI 51 and the digital camera 50 comprising the component. Further, in the case where the electronic device 1 constitutes a logic circuit provided in any semiconductor integrated circuit provided in the digital camera 50, other than the signal processor LSI 51, a similar effect can be obtained.

The imaging device comprising the electronic device 1 should not be limited to the digital camera, and may include any device comprising a semiconductor integrated circuit such as various sensors and electronic calculators, and the like. According to the present invention, the power consumption can be effectively reduced in any electronic device.

Figure 17:
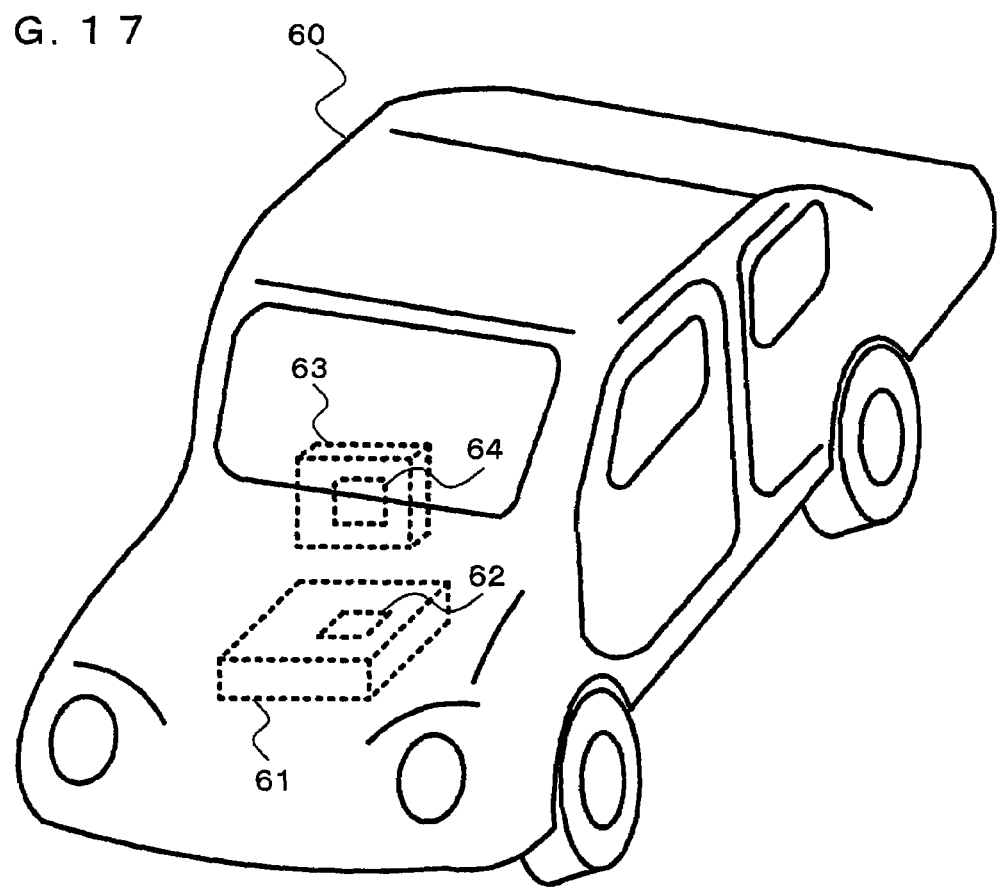
FIG. 17 is a schematic view of a mobile body provided with an electronic control device comprising the electronic device as still another application example of the present preferred embodiment.

FIG. 17 is a schematic view of an electronic control device comprising the electronic device 1 according to the present invention and an automobile 60 (mobile body) comprising the electronic control device. The automobile 60 comprises an electronic control device 61. The electronic control device 61 is a semiconductor integrated circuit provided with the electronic device 1 according to the present invention, and comprises an engine/transmission controller LSI 62 for controlling an engine and transmission of the automobile 60. The automobile 60 further comprises a navigation device 63. The navigation device 63 comprises a navigation LSI 64 which is a semiconductor integrated circuit comprising the electronic device 1 according to the present invention in a manner similar to the electronic control device 61.

Because electronic device 1 is operable with less power than in the conventional technology, the low-power operation is also realized in the engine/transmission controller LSI 62 and the electronic control device 60 comprising the component. Further, the navigation LSI 62 and the navigation device 63 comprising the component are also capable of the low-power operation. Further, in the case where the electronic device 1 constitutes a logic circuit provided in any semiconductor integrated circuit provided in the electronic control device 61 other than the engine/transmission controller LSI 62, a similar effect can be obtained. This can also be applied to the navigation device 63. As a result of the reduction of the power consumption in the electronic control device 61, the power consumption in the automobile 60 can be reduced.

The electronic control device comprising the electronic device 1 should not be limited to the device for controlling the engine and the transmission, and may include any device comprising a semiconductor integrated circuit such as a motor control circuit for controlling a power source. According to the present invention, the power consumption can be effectively reduced in such an electronic control device.

The mobile body comprising the electronic device 1 should not be limited to the automobile, and may include any device comprising the electronic control device for controlling the engine, motor and the like as a power source such as a train and an airplane. According to the present invention, the power consumption can be reduced in such a mobile body.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. An electronic device comprising:
   a signal wire;
   a first signal-wire drive transistor; and
   a control circuit for detecting a transition state of the signal wire and controlling a gate voltage of the first signal-wire drive transistor, wherein
   a source of the first signal-wire drive transistor is connected to a first power supply,
   a drain of the first signal-wire drive transistor is connected to the signal wire, and
   the control circuit controls the gate voltage so that a current flowing in the signal wire is amplified toward a voltage to which the potential of the signal wire transits during the potential transition in the signal wire, and the control circuit further controls the gate voltage so that a voltage value obtained after the potential transition in the signal wire is retained after the potential transition in the signal wire,
   wherein no logic gate is located between the drain of the first signal-wire drive transistor and the signal wire.

2. The electronic device as claimed in claim 1, further comprising a second signal-wire drive transistor having a polarity reverse to the polarity of the first signal-wire drive transistor, wherein
   a source of the second signal-wire drive transistor is connected to a second power supply having a polarity reverse to the polarity of the first power supply,
   the drain of the first signal-wire drive transistor is connected to the signal wire, and
   the control circuit further controls a gate voltage of the second signal-wire drive transistor.

3. The electronic device as claimed in claim 1, wherein
   the control circuit comprises a voltage retaining circuit, wherein
   the voltage retaining circuit retains the gate voltage of the first signal-wire drive transistor so that the voltage value obtained after the potential transition in the signal wire is retained after the potential transition in the signal wire.

4. The electronic device as claimed in claim 3, wherein
   the voltage retaining circuit comprises a diode, wherein
   a cathode of the diode is connected to a gate of the first signal-wire drive transistor.

5. The electronic device as claimed in claim 4, wherein a first voltage-retaining MOS transistor in which a gate and a drain are connected to each other constitutes the diode.

6. The electronic device as claimed in claim 5, wherein a source of the first voltage-retaining MOS transistor is connected to the first power supply.

7. The electronic device as claimed in claim 5, wherein a substrate voltage of the first voltage-retaining MOS transistor is controllable.

8. The electronic device as claimed in claim 5, wherein the voltage retaining circuit further comprises a DC-cutting MOS transistor, wherein
a drain of the DC-cutting MOS transistor is connected to a gate of the first voltage-retaining MOS transistor, and
a source of the DC-cutting MOS transistor is connected to a drain of the first voltage-retaining MOS transistor.

9. The electronic device as claimed in claim 8, wherein the control circuit comprises a delay circuit to which a signal is inputted from the signal wire, wherein
a gate of the DC-cutting MOS transistor is connected to an inversion output of the delay circuit.

10. The electronic device as claimed in claim 5, further comprising a direct-current-cutting switch circuit controlled by the signal wire, wherein
the cathode of the diode is connected to one of input terminals of the direct-current -cutting switch circuit, and
the second power supply having the polarity reverse to the polarity of the first power supply is connected to the other input terminal of the direct-current-cutting switch circuit.

11. The electronic device as claimed in claim 10, wherein the direct-current-cutting switch circuit comprises two switching MOS transistors serially connected to each other and being opposite in polarity, wherein
the switching MOS transistor having the same polarity as the polarity of the first voltage-retaining MOS transistor is connected to the drain of the first voltage-retaining MOS transistor, and gates of the switching MOS transistors are connected to the signal wire.

12. The electronic device as claimed in claim 1, wherein the control circuit comprises a transition-amplifying switch circuit controlled by the signal wire, wherein
the gate of the first signal-wire drive transistor is connected to one of input terminals of the transition-amplifying switch circuit, and
a power supply having the same polarity as the polarity of the first power supply is connected to the other input terminal of the transition-amplifying switch circuit.

13. The electronic device as claimed in claim 12, wherein the transition-amplifying switch circuit comprises a switch-circuit MOS transistor having the same polarity as the polarity of the first signal-wire drive transistor, wherein
a gate of the switch-circuit MOS transistor is connected to the signal wire, and
a drain of the switch-circuit MOS transistor is connected to the gate of the first signal-wire drive transistor.

14. The electronic device as claimed in claim 1, wherein the control circuit comprises a current amplifying circuit, wherein
the current amplifying circuit controls the gate voltage so that the current flowing in the signal wire is amplified toward the voltage to which the potential of the signal wire transits during the potential transition in the signal wire.

15. The electronic device as claimed in claim 14, wherein the current amplifying circuit comprises first and second current-amplifying MOS transistors, wherein
a drain of the first current-amplifying MOS transistor is connected to the gate of the first signal-wire MOS transistor,
a source of the first current-amplifying MOS transistor is connected to a drain of the second current-amplifying MOS transistor, and
a source of the second current-amplifying MOS transistor is connected to the second power supply having the polarity reverse to the polarity of the first power supply.

16. The electronic device as claimed in claim 15, wherein the control circuit comprises a delay circuit to which a signal is inputted from the signal wire, wherein
the delay circuit comprises an inversion output, and
a gate of one of the first and second current-amplifying MOS transistors is connected to the signal wire, and a gate of the other current-amplifying MOS transistor is connected to the inversion output of the delay circuit.

17. The electronic device as claimed in claim 16, wherein the delay circuit can change a delay amount thereof depending on a waveform tilt of the signal wire.

18. The electronic device as claimed in claim 14, wherein the current amplifying circuit can change an output voltage thereof depending on a cycle of a voltage waveform in the signal wire.

19. The electronic device as claimed in claim 14, wherein the current amplifying circuit comprises a flip-flop to which data is inputted from the signal wire, wherein
the flip-flop variably controls an output voltage of the current amplifying circuit depending on an immediate value and a previous value of the signal wire.

20. The electronic device as claimed in claim 19, further comprising a clock wire physically provided along the signal wire, wherein
a clock is supplied from the clock wire to the flip-flop, and the clock synchronizes with a signal transmitted on the signal wire.

21. The electronic device as claimed in claim 14, wherein the current amplifying circuit selectively controls the gate voltage of each of the first signal-wire drive transistors depending on the cycle of the voltage waveform in the signal wire.

22. The electronic device as claimed in claim 16, further comprising a resistance element connected to the signal wire, wherein
the delay circuit is a differential circuit, and
one of differential input signals of the differential circuit is supplied from the signal wire, and the other differential input signal is supplied from an end of the resistance element.

23. The electronic device as claimed in claim 16, further comprising a second signal-wire drive transistor having a polarity reverse to the polarity of the first signal-wire drive transistor and controlled by the control circuit, wherein
the delay circuit is a differential circuit, and
one of differential input signals of the differential circuit is supplied from the signal wire, and the other differential input signal is supplied from a gate of the second signal-wire drive transistor.

24. The electronic device as claimed in claim 22, wherein the current amplifying circuit further comprises a bypass MOS transistor, wherein
the bypass MOS transistor is connected in parallel to the first current-amplifying MOS transistor or the second current-amplifying MOS transistor whose gate is connected to the signal wire, and
a normal-rotation output of the differential circuit is connected to a gate of the bypass MOS transistor.

25. The electronic device as claimed in claim 23, wherein the current amplifying circuit further comprises a bypass MOS transistor, wherein
the bypass MOS transistor is connected in parallel to the first current-amplifying MOS transistor or the second current-amplifying MOS transistor whose gate is connected to the signal wire, and
a normal-rotation output of the differential circuit is connected to a gate of the bypass MOS transistor.

* * * * *